(12) United States Patent
Hwang et al.

(10) Patent No.: US 11,908,775 B2
(45) Date of Patent: Feb. 20, 2024

(54) SEMICONDUCTOR DEVICE

(71) Applicant: SAMSUNG ELECTRONICS CO., LTD., Suwon-si (KR)

(72) Inventors: Jaewon Hwang, Seongnam-si (KR); Kwangjin Moon, Hwaseong-si (KR); Hojin Lee, Hwaseong-si (KR); Hyungjun Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 17/645,472

(22) Filed: Dec. 22, 2021

(65) Prior Publication Data

US 2022/0359348 A1 Nov. 10, 2022

(30) Foreign Application Priority Data

May 10, 2021 (KR) .................. 10-2021-0060339

(51) Int. Cl.
*H01L 23/48* (2006.01)
*H01L 23/485* (2006.01)
(Continued)

(52) U.S. Cl.
CPC .......... *H01L 23/485* (2013.01); *H01L 23/481* (2013.01); *H01L 23/535* (2013.01); *H01L 24/29* (2013.01); *H01L 24/45* (2013.01)

(58) Field of Classification Search
CPC ....... H01L 23/00; H01L 23/48; H01L 23/481; H01L 23/485; H01L 23/532; H01L 23/535; H01L 23/528; H01L 23/498; H01L 23/49827; H01L 23/5283; H01L 23/53295; H01L 24/05; H01L 24/06; H01L 24/13; H01L 24/16; H01L 24/29; H01L 24/45; H01L 21/768; H01L 21/76813; H01L 21/76829; H01L 21/76832; H01L 21/76898; H01L 2224/0401; H01L 2224/06181; H01L 2224/16145; H01L 2224/16146; H01L 2224/16225; H01L 2924/181; H01L 2924/15311; H01L 29/78;
(Continued)

(56) References Cited

U.S. PATENT DOCUMENTS 8,563,403 B1 * 10/2013 Farooq ................ H01L 21/8221 257/E21.597
8,609,538 B2 12/2013 Hill et al.
(Continued)

*Primary Examiner* — Chuong A Luu
(74) *Attorney, Agent, or Firm* — F. CHAU & ASSOCIATES, LLC

(57) ABSTRACT

A semiconductor device includes a semiconductor substrate having a first surface adjacent to an active layer; a first insulating layer disposed on the first surface of the semiconductor substrate; a second insulating layer disposed on the first insulating layer; an etch stop structure interposed between the first insulating layer and the second insulating layer and including a plurality of etch stop layers; a contact wiring pattern disposed inside the second insulating layer and surrounded by at least one etch stop layer of the plurality of etch stop layers; and a through electrode structure configured to pass through the semiconductor substrate, the first insulating layer, and at least one etch stop layer of the plurality of etch stop layers in a vertical direction and contact the contact wiring pattern.

11 Claims, 28 Drawing Sheets

(51) Int. Cl.
*H01L 23/535* (2006.01)
*H01L 23/00* (2006.01)

(58) Field of Classification Search
CPC ............... H01L 29/785; H01L 29/417; H01L 29/41791; H01L 23/538; H01L 23/5386
USPC .......................................................... 257/758
See application file for complete search history.

(56) References Cited

U.S. PATENT DOCUMENTS

| | | |
|---|---|---|
| 8,742,588 B2 | 6/2014 | Nilsson et al. |
| 9,245,800 B2 | 1/2016 | Matsuura |
| 9,536,964 B2 | 1/2017 | Shiao et al. |
| 10,854,508 B2 | 12/2020 | Wu et al. |
| 2009/0098725 A1 | 4/2009 | Nam et al. |
| 2015/0221694 A1* | 8/2015 | Baba ................. H01L 27/14636 257/443 |
| 2016/0372413 A1 | 12/2016 | Mahalingam et al. |
| 2019/0333807 A1 | 10/2019 | Tung et al. |
| 2020/0343293 A1* | 10/2020 | Kawano ............ H01L 21/76849 |
| 2021/0066123 A1 | 3/2021 | Hwang et al. |

\* cited by examiner

SEMICONDUCTOR DEVICE

CROSS-REFERENCE TO RELATED APPLICATION

This application claims priority under 35 U.S.C. § 119 to Korean Patent Application No. 10-2021-0060339, filed on May 10, 2021, in the Korean Intellectual Property Office, the disclosure of which is incorporated by reference herein in its entirety.

TECHNICAL FIELD

The present inventive concept relates to a semiconductor device.

DISCUSSION OF RELATED ART

A semiconductor device may include a semiconductor substrate including individual devices, a wiring pattern connected to the individual devices, and a through electrode structure passing through the semiconductor substrate. For the semiconductor device to have high storage capacity, a semiconductor package including the semiconductor device is required to be thin and light. Accordingly, a shape of the wiring pattern included in the semiconductor device is getting more complicated, and sizes of the wiring pattern and the through electrode structure are becoming thinner and smaller. For example, the sizes of the through electrode structure and the wiring pattern may be in nanometers, such that a proper structure configuration and a finely adjusted process may be needed to ensure that the semiconductor device and the semiconductor package fabricated have reliable structures.

SUMMARY

The present inventive concept provides a semiconductor device with an enhanced structural reliability.

The present inventive concept also provides a thin and light semiconductor device.

According to an embodiment of the present inventive concept, there is provided a semiconductor device including a semiconductor substrate having a first surface adjacent to an active layer; a first insulating layer disposed on the first surface of the semiconductor substrate; a second insulating layer disposed on the first insulating layer; an etch stop structure interposed between the first insulating layer and the second insulating layer and including a plurality of etch stop layers; a contact wiring pattern disposed inside the second insulating layer and surrounded by at least one etch stop layer of the plurality of etch stop layers; and a through electrode structure configured to pass through the semiconductor substrate, the first insulating layer, and at least one etch stop layer of the plurality of etch stop layers in a vertical direction and contact the contact wiring pattern.

According to an embodiment of the present inventive concept, there is provided a semiconductor device including a semiconductor substrate having a first surface adjacent to an active layer; a first insulating layer disposed on the first surface of the semiconductor substrate; a second insulating layer disposed on the first insulating layer; an etch stop structure interposed between the first insulating layer and the second insulating layer and including a first etch stop layer disposed on a lower portion of the first insulating layer, a second etch stop layer disposed on a lower portion of the first etch stop layer, and a third etch stop layer disposed between the second etch stop layer and the second insulating layer; a contact wiring pattern disposed on the second etch stop layer and surrounded by the third etch stop layer and the second insulating layer; and a through electrode structure configured to pass through the semiconductor substrate, the first insulating layer, the first etch stop layer, and the second etch stop layer and contact the contact wiring pattern, the through electrode structure having a width of about 10 nanometers to about 200 nanometers.

According to an embodiment of the present inventive concept, there is provided a semiconductor device including a semiconductor substrate having a first surface adjacent to an active layer; a first insulating layer disposed on the first surface of the semiconductor substrate; a second insulating layer disposed on the first insulating layer; an etch stop structure interposed between the first insulating layer and the second insulating layer and including a plurality of etch stop layers; a contact wiring pattern disposed between the first insulating layer and the second insulating layer and surrounded by the plurality of etch stop layers; and a through electrode structure configured to pass through the semiconductor substrate, the first insulating layer, and at least one etch stop layer of the plurality of etch stop layers in a vertical direction and contact the contact wiring pattern.

The semiconductor device may include an etch stop structure disposed between the through electrode structure and the second insulating layer and including a plurality of etch stop layers. The semiconductor device according to an embodiment of the present inventive concept may include the etch stop structure, and thus degrees of etching of the semiconductor substrate and the first insulating layer need to be finely adjusted in an operation of etching the semiconductor substrate and the first insulating layer and forming the through hole in which the through electrode structure is disposed. Accordingly, a structural reliability between the through electrode structure of the semiconductor device and the contact wiring pattern connected to the through electrode structure may be enhanced.

BRIEF DESCRIPTION OF THE DRAWINGS

Embodiments of the present inventive concept will be more clearly understood from the following detailed description taken in conjunction with the accompanying drawings in which.

Figure 1:
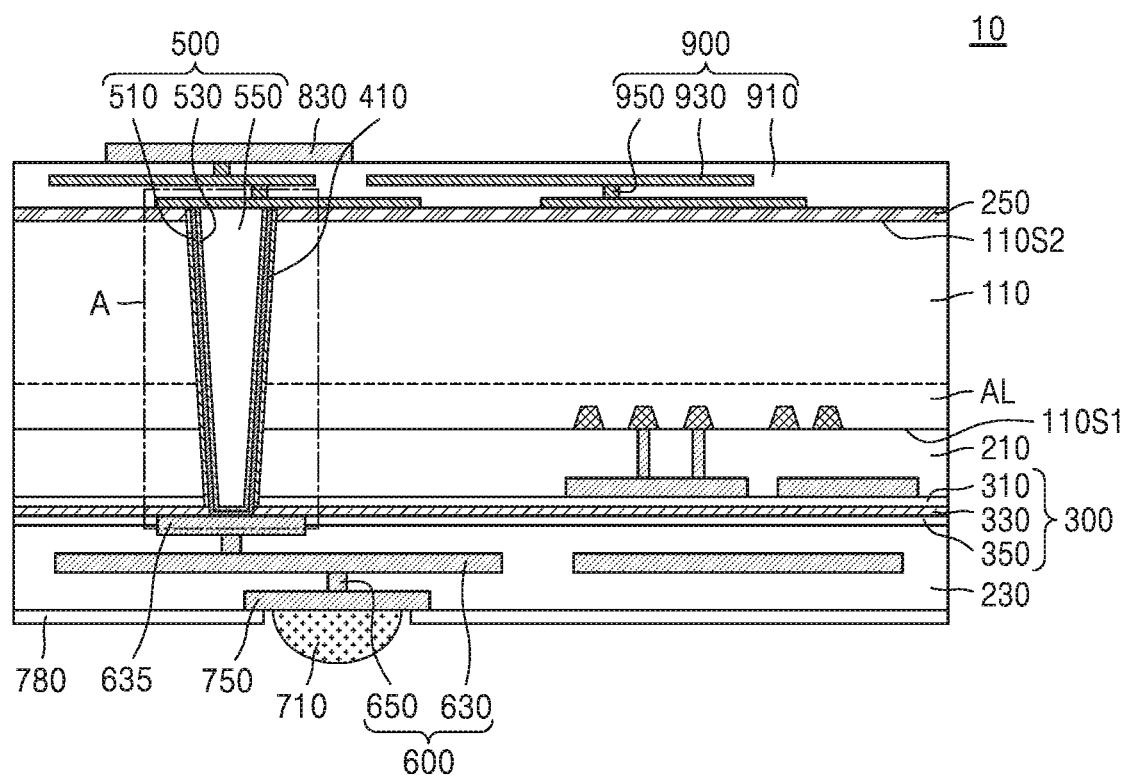
FIG. 1 is a cross-sectional view of a semiconductor device according to an embodiment of the present inventive concept.

Since the drawings in FIGS. 1-10J are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, embodiments of the present inventive concept will be described in detail with reference to the accompanying drawings.

Figure 2:
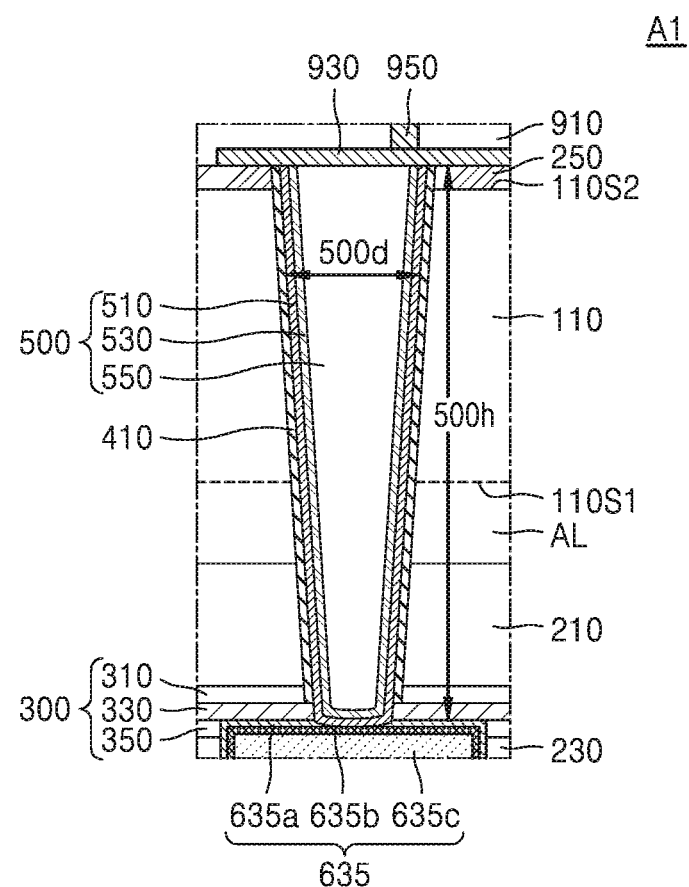
FIGS. 2 and 3 are enlarged views of region A in FIG. 1.
Figure 3:
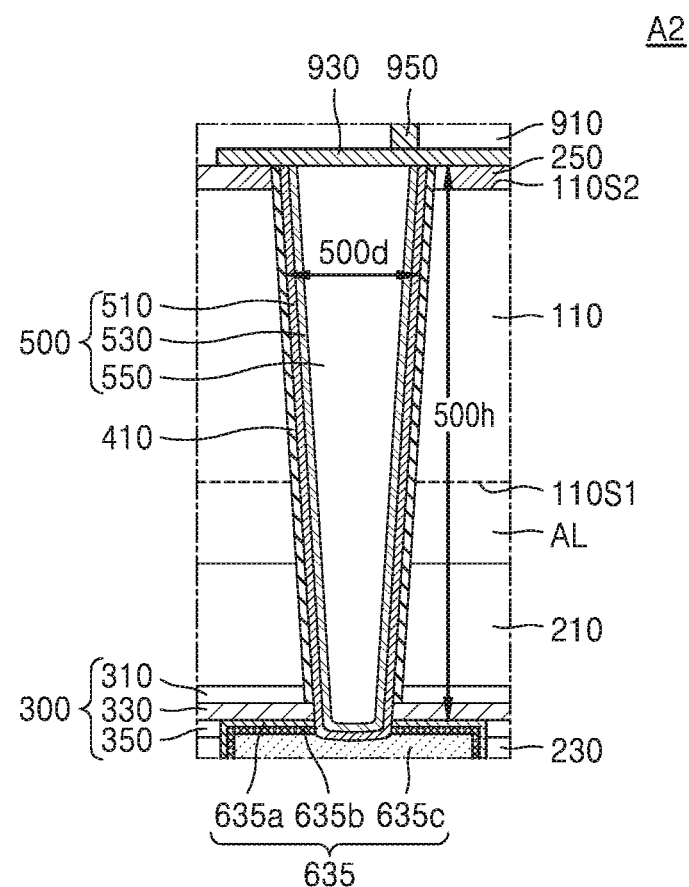

FIG. 1 is a cross-sectional view of a semiconductor device 10 according to an embodiment of the present inventive concept. FIGS. 2 and 3 are enlarged views of region A in FIG. 1.

Referring to FIGS. 1 to 3, the semiconductor device 10 according to an embodiment of the present inventive concept may include a semiconductor substrate 110, a first insulating layer 210, a second insulating layer 230, a third insulating layer 250, an etch stop structure 300, a separation layer 410, a through electrode structure 500, a lower wiring pattern 600, a connection terminal 710, a terminal pad 750, a protective layer 780, an upper wiring structure 900, and a conductive pad 830.

The semiconductor device 10 according to an embodiment of the present inventive concept may be, for example, a memory chip, a logic chip, or a semiconductor chip including a combination thereof.

The semiconductor substrate 110 may be a wafer-level or chip-level substrate. In an embodiment of the present inventive concept, the semiconductor substrate 110 may include silicon (Si). In addition, the semiconductor substrate 110 may include a semiconductor element such as germanium (Ge), or a compound semiconductor such as, for example, silicon carbide (SiC), silicon germanium (SiGe), silicon germanium carbide (SiGeC), gallium arsenide (GaAs), gallium antimonide (GaSb), gallium phosphide (GaP), indium arsenide (InAs), indium phosphide (InP), indium antimonide (InSb), lead tellurium (PbTe) compounds, or indium gallium arsenide (InGaAs). However, the material of the semiconductor substrate 110 is not limited to the above. Also, the semiconductor substrate 110 may include one or more semiconductor layers or structures and may include active or operable portions of semiconductor devices.

The semiconductor substrate 110 may have a first surface 110S1 and a second surface 110S2 that face each other. For example, the first surface 110S1 of the semiconductor substrate 110 may be a front surface adjacent to an active layer AL, and the second surface 110S2 may be a rear surface opposite to the first surface 110S1. The second surface 110S2 of the semiconductor substrate 110 may be in parallel with the first surface 110S1 of the semiconductor substrate 110.

The semiconductor substrate 110 may include the active layer AL in a part adjacent to the first surface 110S1. In an embodiment of the present inventive concept, the active layer AL may include various types of a plurality of individual devices. For example, the plurality of individual devices may include various microelectronic devices such as, for example, a complementary metal-oxide semiconductor (CMOS) transistor, a metal-oxide-semiconductor field effect transistor (MOSFET), a system large scale integration (LSI), an image sensor such as a CMOS imaging sensor (CIS), a micro-electro-mechanical system (MEMS), an active device, a passive device, etc.

In an embodiment of the present inventive concept, the plurality of individual devices in the active layer AL may be electrically connected to the lower wiring line pattern 630 through the lower wiring via pattern 650.

The first insulating layer 210 may be disposed on the first surface 110S1 of the semiconductor substrate 110. In an embodiment of the present inventive concept, the first insulating layer 210 may include an oxide or a nitride. For example, the first insulating layer 210 may include, for example, silicon oxide ($SiO_2$) or silicon nitride ($Si_3N_4$). However, the present inventive concept is not limited thereto. For example, in an embodiment of the present inventive concept, the first insulating layer 210 may include, for example, silicon oxynitride (SiON), silicon oxycarbonitride (SiOCN), silicon boronitride (SiBN), silicon oxyboronitride (SiOBN), or silicon oxycarbide (SiOC). The first insulating layer 210 may be a single layer or multiple layers.

In an embodiment of the present inventive concept, the first insulating layer 210 may include an insulating material of a photo imageable dielectric (PID) material with respect to which a photolithography process may be performed. For example, the first insulating layer 210 may include photosensitive polyimide (PSPI).

The etch stop structure 300 may be disposed on the first insulating layer 210. In an embodiment of the present inventive concept, the etch stop structure 300 may be interposed between the first insulating layer 210 and the second insulating layer 230.

In an embodiment of the present inventive concept, the etch stop structure 300 may include a plurality of etch stop layers. For example, the etch stop structure 300 may include three etch stop layers, for example, first, second and third etch stop layers 310, 330, and 350. That is, the etch stop structure 300 may include the first etch stop layer 310, the second etch stop layer 330, and the third etch stop layer 350. In an embodiment of the present inventive concept, the third etch stop layer 350, the second etch stop layer 330, and the first etch stop layer 310 may be sequentially stacked on the second insulating layer 230.

The number of etch stop layers included in the etch stop structure 300 is not limited to three described above. For example, the etch stop structure 300 may include more than three etch stop layers.

In an embodiment of the present inventive concept, each of the first to third etch stop layers 310, 330, and 350 may have a thickness of about 1 nanometer to about 10 nanometers. Accordingly, the etch stop structure 300 may have a thickness of about 3 nanometers to about 30 nanometers. That is, the sum of thicknesses of the first etch stop layer 310, the second etch stop layer 330, and the third etch stop layer 350 may be about 3 nanometers to about 30 nanometers. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In an embodiment of the present inventive concept, the etch stop structure 300 may have a structure in which two different types of materials are alternately stacked. For example, the etch stop structure 300 may have a structure in which two materials having different etch selectivities are alternately stacked.

In an embodiment of the present inventive concept, the first etch stop layer 310 may include a material that has a relatively low etch rate or is not etched in a dry etching process. The material of the first etch stop layer 310 may be different from a material of the second etch stop layer 330. For example, the etch rate of the material of the first etch stop layer 310 may be lower than that of the material of the second etch stop layer 330 in the dry etching process. Also, the material of the first etch stop layer 310 may be substantially the same as that of the third etch stop layer 350.

The first etch stop layer 310 and the third etch stop layer 350 may have a material having a relatively high etch rate in a wet etching process, and the second etch stop layer 330 interposed between the first etch stop layer 310 and the third etch stop layer 350 may have a material having a relatively low etch rate or not etched in the wet etching process.

In an embodiment of the present inventive concept, the materials of the first etch stop layer 310 and the third etch stop layer 350 may include a metal material such as, for example, nickel (Ni), copper (Cu), tungsten (W), titanium (Ti), tantalum (T a), indium (In), molybdenum (Mo), manganese (Mn), cobalt (Co), tin (Sn), magnesium (Mg), rhenium (Re), beryllium (Be), gallium (Ga), ruthenium (Ru), aluminum (Al), etc. In an embodiment of the present inventive concept, the materials of the first etch stop layer 310 and the third etch stop layer 350 may be dielectric materials containing metals.

The second etch stop layer 330 may include a material having a relatively high etch rate in the dry etching process. For example, the material of the second etch stop layer 330 may include, for example, silicon (Si), carbon (C), oxygen (O), nitrogen (N), and/or hydrogen (H). For example, the material of the second etch stop layer 330 may include at least one of silicon oxide ($SiO_2$), silicon nitride ($Si_3N_4$), or silicon carbonitride (SiCN). In an embodiment of the present inventive concept, the material of the second etch stop layer 330 may be a dielectric material containing silicon (Si).

In an embodiment of the present inventive concept, a part of the etch stop structure 300 may surround a part of a side surface of the through electrode structure 500. For example, the first etch stop layer 310 and the second etch stop layer 330 of the etch stop structure 300 may surround the part of the side surface of the through electrode structure 500.

A part of the etch stop structure 300 may surround a part of a side surface of a contact wiring pattern 635 as described below. For example, the third etch stop layer 350 of the etch stop structure 300 may surround the part of the side surface of the contact wiring pattern 635.

The second insulating layer 230 may be disposed on the etch stop structure 300. In an embodiment of the present inventive concept, the second insulating layer 230 may include an oxide or a nitride. For example, the second insulating layer 230 may include, for example, silicon oxide ($SiO_2$) or silicon nitride ($Si_3N_4$). However, the present inventive concept is not limited thereto. For example, in an embodiment of the present inventive concept, the second insulating layer 230 may include, for example, silicon oxynitride (SiON), silicon oxycarbonitride (SiOCN), silicon boronitride (SiBN), silicon oxyboronitride (SiOBN), or silicon oxycarbide (SiOC). The second insulating layer 230 may be a single layer or multiple layers.

The lower wiring pattern 600 may include a lower wiring line pattern 630 extending in a horizontal direction in the first insulating layer 210 and the second insulating layer 230, and a lower wiring via pattern 650 extending in a vertical direction in the first insulating layer 210 and the second insulating layer 230 to interconnect the lower wiring line patterns 630 to each other or extending in the vertical direction in the first insulating layer 210 and the second insulating layer 230 to connect the individual devices in the active layer AL and the lower wiring line pattern 630 to each other.

The lower wiring line patterns 630 may each include a plurality of layers extending in the horizontal direction in the first insulating layer 210 and the second insulating layer 230, and may be electrically connected to each other through the lower wiring via pattern 650. In an embodiment of the present inventive concept, when the lower wiring line pattern 630 is viewed in a plan view, a width of the lower wiring line pattern 630 may be about 10 nanometers to about 100 nanometers.

In an embodiment of the present inventive concept, a part of the lower wiring line pattern 630 may be configured to transmit a data signal and/or a control signal, and the other part thereof may be configured to transmit a power signal.

In an embodiment of the present inventive concept, the lower wiring line pattern 630 in contact with the through electrode structure 500 among the lower wiring line patterns 630 may be defined as a contact wiring pattern 635. A side surface of the contact wiring pattern 635 may be surrounded by a part of the second insulating layer 230 and a part of the etch stop structure 300. For example, the side surface of the contact wiring pattern 635 may be surrounded by the second insulating layer 230 and the third etch stop layer 350, and an upper surface of the contact wiring pattern 635 may be in contact with the through electrode structure 500 and the second etch stop layer 330. For example, a lower surface of the second etch stop layer 330 may be coplanar with the upper surface of the contact wiring pattern 635. The contact wiring pattern 635 may extend in the horizontal direction and have a relatively uniform separation distance from the first surface 110S1 of the semiconductor substrate 110 in the vertical direction. In an embodiment of the present inventive concept, when the contact wiring pattern 635 is viewed in a plan view, a width of the contact wiring pattern 635 may be about 10 nanometers to about 100 nanometers.

Referring to FIGS. 2 and 3, the contact wiring pattern 635 may include a barrier metal layer 635a, a seed metal layer 635b, and a metal pattern 635c.

In an embodiment of the present inventive concept, the barrier metal layer 635a may be interposed between the second insulating layer 230 and the seed metal layer 635b and between the second etch stop layer 330 and the seed metal layer 635b. A part of the barrier metal layer 635a may be surrounded by the third etch stop layer 350. Also, a part of the barrier metal layer 635a may surround at least a part of the through electrode structure 500.

In an embodiment of the present inventive concept, the barrier metal layer 635a may include at least one of, for example, titanium (Ti), titanium nitride (TiN), tantalum (Ta), tantalum nitride (TaN), tungsten (W), or tungsten nitride (WN). However, the present inventive concept is not limited thereto.

In an embodiment of the present inventive concept, the seed metal layer 635b may be interposed between the barrier metal layer 635a and the metal pattern 635c. As shown in FIG. 2, the seed metal layer 635b may not directly contact the through electrode structure 500. However, the present inventive concept is not limited thereto, and as shown in FIG. 3, the seed metal layer 635b may surround a part of a side surface of the through electrode structure 500 and may directly contact the through electrode structure 500. For example, the through electrode structure 500 may be configured to pass through at least a part of the contact wiring pattern 635 and may be surrounded by the contact wiring pattern 635.

In an embodiment of the present inventive concept, the seed metal layer 635*b* may include, for example, copper (Cu), manganese (Mn), titanium (Ti), tungsten (W), cobalt (Co), molybdenum (Mo), ruthenium (Ru), or an alloy thereof. However, the present inventive concept is not limited thereto.

In an embodiment of the present inventive concept, the metal pattern 635*c* may be a pattern of a conductive material filled in a concave space formed by the barrier metal layer 635*a* and the seed metal layer 635*b*. For example, upper and side surfaces of the metal pattern 635*c* may be surrounded by the seed metal layer 635*b*. Also, a part of a lower surface of the metal pattern 635*c* may contact the second insulating layer 230 and the lower wiring via pattern 650. The seed metal layer 635*b* does not cover the lower surface of the metal pattern 635*c*.

Referring to FIG. 2, the metal pattern 635*c* may not directly contact the through electrode structure 500. However, the present inventive concept is not limited thereto, and referring to FIG. 3, the metal pattern 635*c* may surround a part of the through electrode structure 500 and may directly contact the through electrode structure 500. That is, the contact wiring pattern 635 may surround at least a part of a side surface of the through electrode structure 500.

In an embodiment of the present inventive concept, the metal pattern 635*c* may include, for example, copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), and/or an alloy thereof. However, the present inventive concept is not limited thereto.

The separation layer 410 may be interposed between the semiconductor substrate 110 and the through electrode structure 500, between the first insulating layer 210 and the through electrode structure 500, and between a part of the etch stop structure 300 and the through electrode structure 500. For example, the part of the etch stop structure 300 may be the first etch stop layer 310, and the separation layer 410 may be interposed between the first etch stop layer 310 and the through electrode structure 500. The separation layer 410 may prevent a leakage current from being generated by the through electrode structure 500. For example, the separation layer 410 may electrically separate the semiconductor substrate 110 and the through electrode structure 500, and thus may prevent and/or suppress the leakage current of the through electrode structure 500.

In an embodiment of the present inventive concept, the separation layer 410 may include an insulating material. For example, the separation layer 410 may include, for example, silicon oxide (SiO$_2$) or silicon oxynitride (SiON). However, a material of the separation layer 410 is not limited to the above.

A part of the separation layer 410 may contact the etch stop structure 300. For example, a part of the separation layer 410 may be in contact with the second etch stop layer 330 and may be surrounded by the first etch stop layer 310.

The through electrode structure 500 may pass through the semiconductor substrate 110, the first insulating layer 210, and a part of the etch stop structure 300 in the vertical direction to contact the contact wiring pattern 635. Hereinafter, the vertical direction may be defined as a direction perpendicular to a direction in which the first surface 110S1 of the semiconductor substrate 110 extends, and the horizontal direction may be defined in a direction parallel to the direction in which the first surface 110S1 of the semiconductor substrate 110 extends.

In an embodiment of the present inventive concept, the through electrode structure 500 may pass through the first etch stop layer 310 and the second etch stop layer 330 of the etch stop structure 300 in the vertical direction to contact the contact wiring pattern 635. In addition, a lowermost portion of the through electrode structure 500 may be surrounded by the second etch stop layer 330 and the contact wiring pattern 635.

In an embodiment of the present inventive concept, the first etch stop layer 310 may be disposed on a lower portion, for example, a lower surface, of the first insulating layer 210 and configured to surround a part of a side surface of the through electrode structure 500. The second etch stop layer 330 may be disposed on a lower portion, for example, a lower surface, of the first etch stop layer 310, configured to surround a part of the side surface of the through electrode structure 500, and configured to contact the contact wiring pattern 635. The third etch stop layer 350 may be disposed between the second etch stop layer 330 and the second insulating layer 230 and configured to surround a part of a side surface of the contact wiring pattern 635.

In an embodiment of the present inventive concept, the through electrode structure 500 may have a tapered shape where the cross-sectional area of the through electrode structure 500 in the horizontal direction decreases toward the contact wiring pattern 635. In addition, a length 500*h* (i.e., a height) of the through electrode structure 500 in the vertical direction may be about 0.1 micrometers to about 2 micrometers. In addition, a length 500*d* (i.e., a width) of the through electrode structure 500 in the horizontal direction may be about 30 nanometers to about 200 nanometers. However, the height and width of the through electrode structure 500 are not limited to the values described above.

In an embodiment of the present inventive concept, a bottom surface of the through electrode structure 500 may be round. For example, the bottom surface of the through electrode structure 500 may be convex downward. As the bottom surface of the through electrode structure 500 is round, a contact area between the through electrode structure 500 and the contact wiring pattern 635 may increase. Accordingly, a structural reliability between the through electrode structure 500 and the contact wiring pattern 635 may be enhanced.

In an embodiment of the present inventive concept, the through electrode structure 500 may include a barrier pattern 510, a seed pattern 530, and a conductive via 550.

In an embodiment of the present inventive concept, the barrier pattern 510 may be provided along the side surface and the bottom surface of the through electrode structure 500. The barrier pattern 510 may be interposed between the separation layer 410 and the seed pattern 530, between a part of the etch stop structure 300 and the seed pattern 530, and between the contact wiring pattern 635 and the seed pattern 530. For example, the barrier pattern 510 may be disposed along a surface of the separation layer 410 and configured to contact the contact wiring pattern 635.

The through electrode structure 500 and the contact wiring pattern 635 may be electrically connected. In an embodiment of the present inventive concept, the through electrode structure 500 may extend into the seed metal layer 635*b* so that the barrier pattern 510 contacts and is electrically connected to the seed metal layer 635*b*. In an embodiment of the present inventive concept, the through electrode structure 500 may extend into the metal pattern 635c so that the barrier pattern 510 contacts and is electrically connected to the metal pattern 635c.

The barrier pattern 510 may include at least one of, for example, titanium (Ti), titanium nitride (TiN), tantalum (Ta), tantalum nitride (TaN), ruthenium (Ru), cobalt (Co), tungsten (W), or an alloy thereof.

The seed pattern 530 may extend along an inner surface of the barrier pattern 510, and may be interposed between the barrier pattern 510 and the conductive via 550. The seed pattern 530 may include a conductive material such as metal. For example, the seed pattern 530 may include, for example, copper (Cu), manganese (Mn), titanium (Ti), cobalt (Co), tungsten (W), molybdenum (Mo), ruthenium (Ru), and/or an alloy thereof.

The conductive via 550 may be provided on the seed pattern 530 and may be filled in a through hole, for example, a via hole, defined by an inner surface of the seed pattern 530. In an embodiment of the present inventive concept, the conductive via 550 may include metal such as, for example, copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), and/or an alloy thereof.

In an embodiment of the present inventive concept, uppermost surfaces of the barrier pattern 510, the seed pattern 530, and the conductive via 550 may be substantially coplanar with each other.

The third insulating layer 250 may be disposed on the second surface 110S2 of the semiconductor substrate 110 to cover the second surface 110S2. In addition, the third insulating layer 250 may surround a part of a side surface of the through electrode structure 500 and expose an upper surface of the through electrode structure 500. In an embodiment of the present inventive concept, the third insulating layer 250 may include a carbon-containing material, such as a spin on carbon hard mask (SOC) material. However, the present inventive concept is not limited thereto, and the third insulating layer 250 may be omitted.

The upper wiring structure 900 may include an upper wiring insulating layer 910, an upper wiring line pattern 930 extending in the horizontal direction inside the upper wiring insulating layer 910 and connected to the through electrode structure 500, and an upper wiring via pattern 950 extending in the vertical direction inside the upper wiring insulating layer 910 to interconnect the plurality of upper wiring line patterns 930 or connect the upper wiring line pattern 930 and the conductive pad 830 to each other.

In an embodiment of the present inventive concept, as a size of the through electrode structure 500 is provided in a unit of nanometers, a stable electrical connection between the through electrode structure 500 and the conductive pad 830 may be required. Accordingly, the upper wiring structure 900 may be interposed between the through electrode structure 500 and the conductive pad 830. In other words, the upper wiring line pattern 930 and the upper wiring via pattern 950 of the upper wiring structure 900 may provide a movement path of an electrical signal between the through electrode structure 500 and the conductive pad 830.

The upper wiring insulating layer 910 may be a layer of an insulating material disposed on the second surface 110S2 of the semiconductor substrate 110. In an embodiment of the present inventive concept, the upper wiring insulating layer 910 may include an oxide or a nitride. For example, the upper wiring insulating layer 910 may include, for example, silicon oxide ($SiO_2$) or silicon nitride ($Si_3N_4$).

In an embodiment of the present inventive concept, the upper wiring line pattern 930 may include two or more layers extending in the horizontal direction. For example, the upper wiring line pattern 930 may include three layers extending in the horizontal direction. However, the number of layers included in the upper wiring line pattern 930 is not limited as described above.

The conductive pad 830 may be provided on the upper wiring structure 900, and may be electrically connected to the through electrode structure 500 via the upper wiring line pattern 930 and the upper wiring via pattern 950.

In an embodiment of the present inventive concept, the conductive pad 830 may be disposed on the upper wiring structure 900 to overlap the through electrode structure 500 in the vertical direction. However, the present inventive concept is not limited thereto, and the conductive pad 830 may be disposed on the upper wiring structure 900 so as not to overlap the through electrode structure 500 in the vertical direction. The conductive pad 830 may contact a part of the upper wiring via pattern 950, and may be electrically connected to the through electrode structure 500 via the upper wiring via pattern 950 and the upper wiring line pattern 930.

In an embodiment of the present inventive concept, the conductive pad 830 may be electrically connected to the lower wiring pattern 600 via the through electrode structure 500. For example, the conductive pad 830 may be electrically connected to the plurality of individual devices in the active layer AL through the electrode structure 500 and the lower wiring pattern 600. Also, the conductive pad 830 may function as a terminal electrically connected to an external device. For example, the external device may include, for example, a semiconductor device, a passive device, a substrate, etc. A material of the conductive pad 830 may include a metal such as, for example, copper (Cu), aluminum (Al), titanium (Ti), and/or an alloy thereof.

The terminal pad 750 may be disposed in a lower portion of the second insulating layer 230, and may be electrically connected to the through electrode structure 500 and the plurality of individual devices in the active layer AL through the lower wiring pattern 600. For example, in an embodiment of the present inventive concept, a bottom surface of the terminal pad 750 and a bottom surface of the second insulating layer 230 may be coplanar with each other. In an embodiment of the present inventive concept, the terminal pad 750 may include a metal material such as, for example, copper (Cu), titanium (Ti), or aluminum (Al).

The connection terminal 710 may be attached on the terminal pad 750 and electrically connected to the terminal pad 750. In an embodiment of the present inventive concept, the connection terminal 710 may include a solder ball of a metal material including at least one of, for example, tin (Sn), silver (Ag), copper (Cu), or aluminum (Al).

The protective layer 780 may be provided on the second insulating layer 230 to cover the bottom surface of the second insulating layer 230. The protective layer 780 may have an opening exposing the terminal pad 750 and the connection terminal 710. In an embodiment of the present inventive concept, a material of the protective layer 780 may include an insulating polymer.

Sizes of the through electrode structure 500 and the contact wiring pattern 635 included in the semiconductor device 10 according to an embodiment of the present inventive concept may be in a unit of nanometers. For example, the width 500d of the through electrode structure 500 and the width and thickness of the contact wiring pattern 635 may be in a unit of nanometers. For example, the width 500d of the through electrode structure 500 in the horizontal direction may be about 30 nanometers to about 200 nanometers, and the width of contact wiring pattern 635 may be about 10 nanometers to about 100 nanometers.

In an operation of etching the semiconductor substrate 110 and the first insulating layer 210 and forming a through hole 500H in which the through electrode structure 500 is disposed, the degrees of etching of the semiconductor substrate 110 and the first insulating layer 210 need to be finely adjusted.

When the degrees of etching of the semiconductor substrate 110 and the first insulating layer 210 are not finely adjusted, there is a risk that the contact wiring pattern 635 may be etched. As a result, the through electrode structure 500 and the contact wiring pattern 635 may not have a reliable connection structure.

The semiconductor device 10 according to an embodiment of the present inventive concept may include the etch stop structure 300 disposed between the through electrode structure 500 and the contact wiring pattern 635, the etch stop structure 300 including the plurality of etch stop layers 310, 330, and 350. Also, the etch stop structure 300 may have a structure in which two materials having different etch selectivities are alternately stacked. For example, the first etch stop layer 310 and the third etch stop layer 350 may have a material having a relatively low etch rate in a dry etching process, and the second etch stop layer 330 interposed between the first etch stop layer 310 and the third etch stop layer 350 may have a material having a relatively high etch rate in the dry etching process.

The semiconductor device 10 according to an embodiment of the present inventive concept may include the etch stop structure 300, and thus, the degrees of etching of the semiconductor substrate 110 and the first insulating layer 210 need to be finely adjusted in the operation of etching the semiconductor substrate 110 and the first insulating layer 210 and forming the through hole 500H in which the through electrode structure 500 is disposed. Accordingly, the reliability of a connection structure of the through electrode structure 500 and the contact wiring pattern 635 of the semiconductor device 10 may be enhanced.

Figure 4:
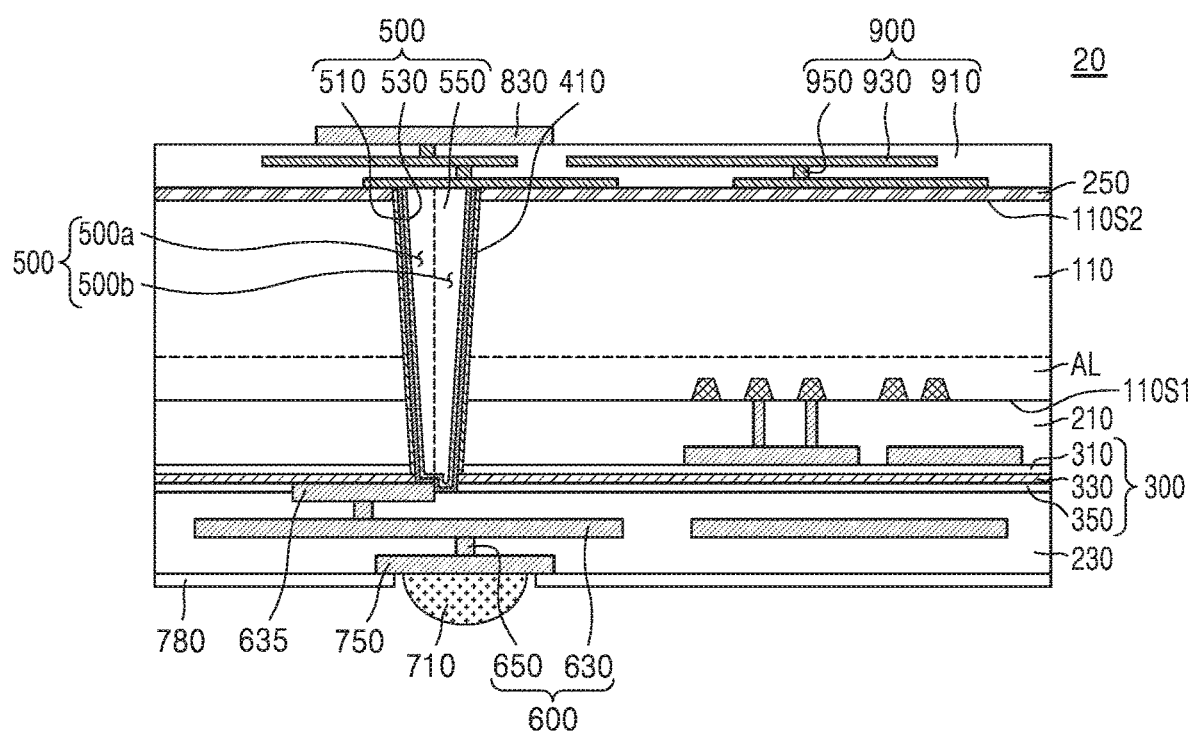
FIG. 4 is a cross-sectional view of a semiconductor device according to an embodiment of the present inventive concept.

FIG. 4 is a cross-sectional view of a semiconductor device 20 according to an embodiment of the present inventive concept.

Hereinafter, redundant descriptions between the semiconductor device 10 of FIG. 1 and the semiconductor device 20 of FIG. 4 are omitted, and differences therebetween are mainly described.

The semiconductor device 20 according to an embodiment of the present inventive concept may include the semiconductor substrate 110, the first insulating layer 210, the second insulating layer 230, the third insulating layer 250, the etch stop structure 300, the separation layer 410, the through electrode structure 500, the lower wiring pattern 600, the connection terminal 710, the terminal pad 750, the protective layer 780, the upper wiring structure 900, and the conductive pad 830.

In an embodiment of the present inventive concept, the through electrode structure 500 may include a first through electrode portion 500a and a second through electrode portion 500b. The first through electrode portion 500a may be a part of the through electrode structure 500 overlapping the contact wiring pattern 635 in a vertical direction. Also, the second through electrode portion 500b may be a part of the through electrode structure 500 disposed outside from a side surface of the contact wiring pattern 635. That is, the second through electrode portion 500b may be a part of the through electrode structure 500 that does not overlap the contact wiring pattern 635 in the vertical direction.

In an embodiment of the present inventive concept, the first through electrode portion 500a of the through electrode structure 500 may pass through the first etch stop layer 310 and the second etch stop layer 330 and be disposed on an upper portion of the contact wiring pattern 635, and the second through electrode portion 500b may pass through the first etch stop layer 310, the second etch stop layer 330, and the third etch stop layer 350 and be disposed on an upper portion of the second insulating layer 230.

In an embodiment of the present inventive concept, a bottom surface of the first through electrode portion 500a of the through electrode structure 500 may contact the contact wiring pattern 635, and a bottom surface of the second through electrode portion 500b may contact a part of the second insulating layer 230.

In an embodiment of the present inventive concept, the second through electrode portion 500b may pass through the etch stop structure 300 to surround at least a part of the side surface of the contact wiring pattern 635. For example, the second through electrode portion 500b may contact a part of a side surface of the contact wiring pattern 635. Accordingly, the through electrode structure 500 and the contact wiring pattern 635 may be electrically connected. Also, the bottom surface of the second through electrode portion 500b may be coplanar with the upper portion, i.e., the upper surface, of the second insulating layer 230.

The semiconductor device 20 according to an embodiment of the present inventive concept may include the etch stop structure 300, and thus, the degrees of etching of the semiconductor substrate 110 and the first insulating layer 210 need to be finely adjusted in the operation of etching the semiconductor substrate 110 and the first insulating layer 210 for manufacturing the through electrode structure 500. Accordingly, the reliability of a connection structure of the through electrode structure 500 and the contact wiring pattern 635 of the semiconductor device 20 may be enhanced.

Figure 5:
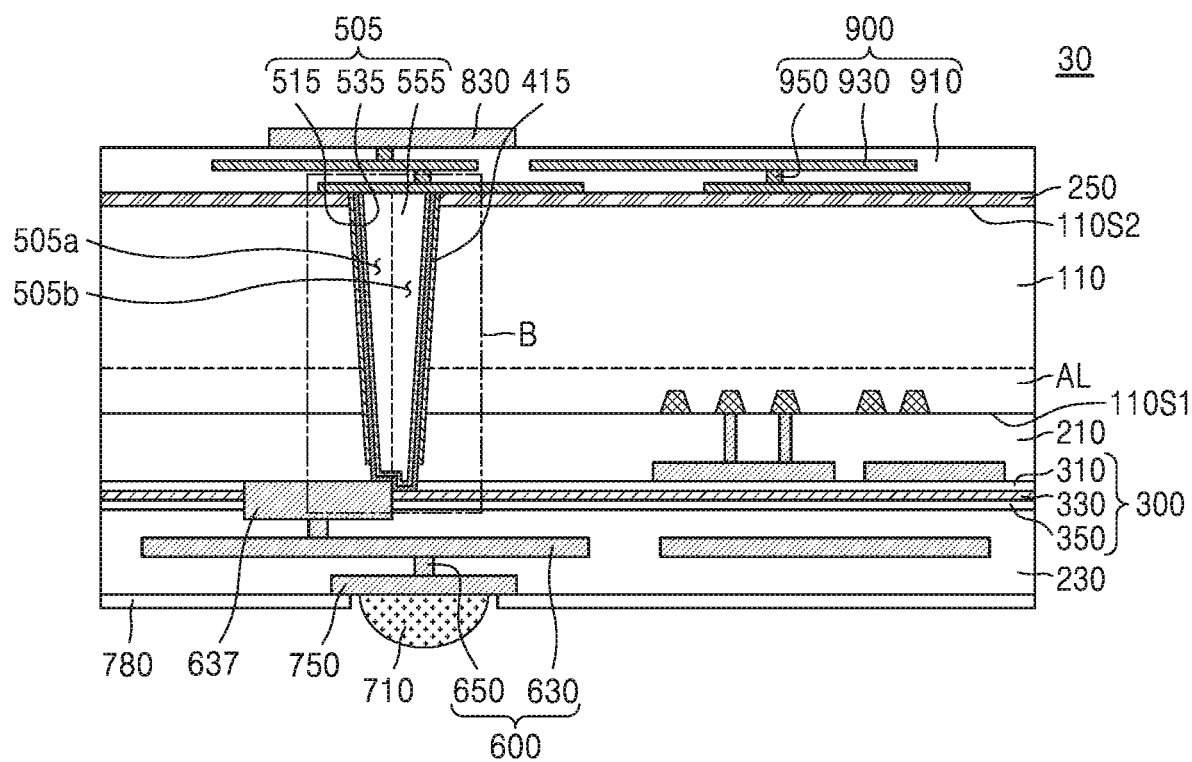
FIG. 5 is a cross-sectional view of a semiconductor device according to an embodiment of the present inventive concept.

FIG. 5 is a cross-sectional view of a semiconductor device 30 according to an embodiment of the present inventive concept. In addition, FIG. 6 is an enlarged view of region B in FIG. 5.

Hereinafter, redundant descriptions between the semiconductor device 10 of FIG. 1 and the semiconductor device 30 of FIG. 5 are omitted, and differences therebetween are mainly described.

Figure 6:
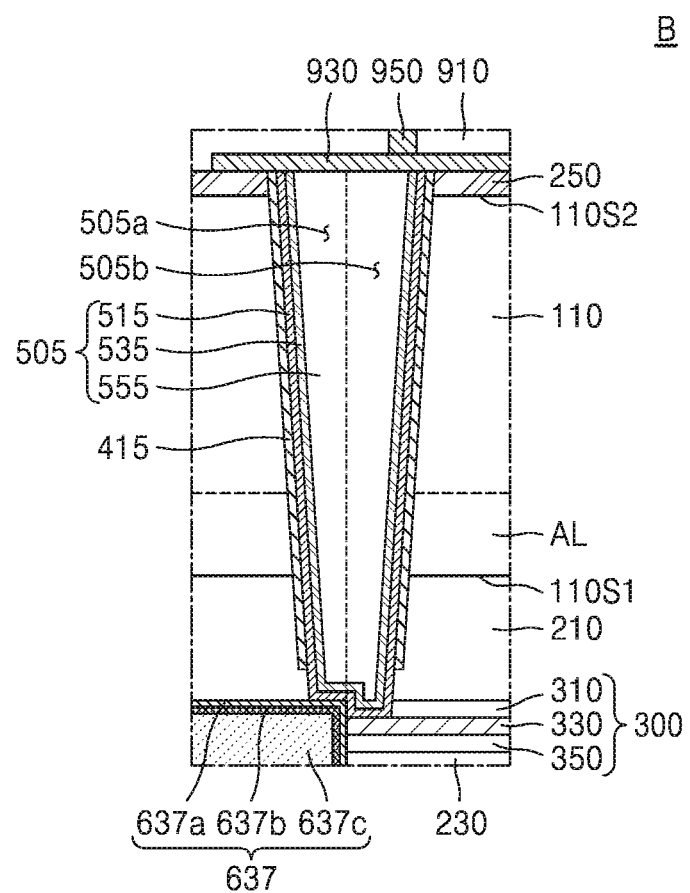
FIG. 6 is an enlarged views of region B in FIG. 5.

Referring to FIGS. 5 and 6 together, the semiconductor device 30 according to an embodiment of the present inventive concept may include the semiconductor substrate 110, the first insulating layer 210, the second insulating layer 230, the third insulating layer 250, the etch stop structure 300, a separation layer 415, a through electrode structure 505, the lower wiring pattern 600, the connection terminal 710, the terminal pad 750, the protective layer 780, the upper wiring structure 900, and the conductive pad 830.

The lower wiring pattern 600 may include a contact wiring pattern 637 in contact with the through electrode structure 505. In an embodiment of the present inventive concept, the contact wiring pattern 637 may be surrounded by the etch stop structure 300. For example, a side surface of the contact wiring pattern 637 may be surrounded by the first etch stop layer 310, the second etch stop layer 330, and the third etch stop layer 350. Also, an upper surface of the contact wiring pattern 637 may be coplanar with a lower surface of the first insulating layer 210. For example, the upper surface of the contact wiring pattern 637 may be coplanar with an upper surface of the first etch stop layer 310.

In an embodiment of the present inventive concept, a thickness of the contact wiring pattern 637 may be greater than a thickness of the etch stop structure 300. Accordingly, when the upper surface of the contact wiring pattern 637 is coplanar with the lower surface of the first insulating layer 210, the side surface of the contact wiring pattern 637 may be surrounded by the etch stop structure 300 and a part of the second insulating layer 230.

In an embodiment of the present inventive concept, the contact wiring pattern 637 may include a barrier metal layer 637a, a seed metal layer 637b, and a metal pattern 637c.

In an embodiment of the present inventive concept, the barrier metal layer 637a may provide the side and upper surfaces of the contact wiring pattern 637. For example, the barrier metal layer 637a may be interposed between the first insulating layer 210 and the seed metal layer 637b, between the second insulating layer 230 and the seed metal layer 637b, and between the etch stop structure 300 and the seed metal layer 637b.

In an embodiment of the present inventive concept, the barrier metal layer 637a may include at least one of, for example, titanium (Ti), titanium nitride (TiN), tantalum (Ta), or tantalum nitride (TaN).

In an embodiment of the present inventive concept, the seed metal layer 637b may be interposed between the barrier metal layer 637a and the metal pattern 637c. In an embodiment of the present inventive concept, a part of the seed metal layer 637b may directly contact the through electrode structure 505. For example, the through electrode structure 505 may extend into the seed metal layer 637b to directly contact the seed metal layer 637b. In an embodiment of the present inventive concept, a part of the metal pattern 637c may directly contact the through electrode structure 505. For example, the through electrode structure 505 may extend into the metal pattern 637c to directly contact the metal pattern 637c.

In an embodiment of the present inventive concept, the seed metal layer 637b may include, for example, copper (Cu), manganese (Mn), titanium (Ti), or an alloy thereof. However, a material of the seed metal layer 637b is not limited thereto.

In an embodiment of the present inventive concept, the metal pattern 637c may be a pattern of a conductive material filled in a concave space formed by the barrier metal layer 637a and the seed metal layer 637b. For example, upper and side surfaces of the metal pattern 637c may be surrounded by the seed metal layer 637b. Also, a part of a lower surface of the metal pattern 637c may contact the second insulating layer 230 and the lower wiring via pattern 650.

In an embodiment of the present inventive concept, the metal pattern 637c may include, for example, copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), and/or an alloy thereof. However, the present inventive concept is not limited thereto.

The separation layer 415 may be interposed between the semiconductor substrate 110 and the through electrode structure 505, and between a part of the first insulating layer 210 and the through electrode structure 505. In an embodiment of the present inventive concept, the separation layer 415 may include an insulating material. For example, the separation layer 415 may include, for example, silicon oxide ($SiO_2$) or silicon oxynitride (SiON).

In an embodiment of the present inventive concept, a length of the separation layer 415 in a vertical direction may be less than a length of the through electrode structure 505 in the vertical direction. The separation layer 415 may electrically separate the semiconductor substrate 110 and the through electrode structure 505, and thus may prevent and/or suppress the leakage current of the through electrode structure 505. For example, the separation layer 415 may pass through the first surface 110S1 and the second surface 110S2 of the semiconductor substrate 110, and an upper surface of the first insulating layer 210. However, the separation layer 415 may not pass through a lower surface of the first insulating layer 210.

The third insulating layer 250 may be disposed on the second surface 110S2 of the semiconductor substrate 110 opposite to the first surface 110S1 thereof and configured to surround a part of a side surface of the separation layer 415. Uppermost surfaces of the third insulating layer 250, the separation layer 415, and the through electrode structure 505 may be coplanar with each other.

The through electrode structure 505 may include a barrier pattern 515, a seed pattern 535, and a conductive via 555.

In an embodiment of the present inventive concept, the barrier pattern 515 may be provided along side and bottom surfaces of the through electrode structure 505. The barrier pattern 515 may be interposed between the separation layer 415 and the seed pattern 535, between the seed metal layer 637b and the seed pattern 535, between the second etch stop layer 330 and the seed pattern 535, and between the first etch stop layer 310 and the seed pattern 535. For example, the barrier pattern 515 may be disposed along a surface of the separation layer 415 and configured to contact the contact wiring pattern 637.

In an embodiment of the present inventive concept, the seed pattern 535 may extend along an inner surface of the barrier pattern 515. The seed pattern 535 may be interposed between the barrier pattern 515 and the conductive via 555. In addition, the conductive via 555 may be provided on the seed pattern 535 and may be filled in a through hole, for example, a via hole, defined by an inner surface of the seed pattern 535.

In an embodiment of the present inventive concept, the through electrode structure 505 may include a first through electrode portion 505a and a second through electrode portion 505b. The first through electrode portion 505a may be a part of the through electrode structure 505 overlapping the contact wiring pattern 637 in the vertical direction. Also, the second through electrode portion 505b may be a part of the through electrode structure 505 disposed outside from the side surface of the contact wiring pattern 637. That is, the second through electrode portion 505b may be a part of the through electrode structure 505 that does not overlap the contact wiring pattern 637 in the vertical direction.

In an embodiment of the present inventive concept, a length of the first through electrode portion 505a in the vertical direction may be less than a length of the second through electrode portion 505b in the vertical direction. Accordingly, the through electrode structure 505 may have a shape having a step outside the contact wiring pattern 637.

In an embodiment of the present inventive concept, the first through electrode portion 505a of the through electrode structure 505 may contact an upper surface of the contact wiring pattern 637. In an embodiment of the present inventive concept, the barrier pattern 515 of the first through electrode portion 505a may contact the seed metal layer 637b of the contact wiring pattern 637. However, the present inventive concept is not limited thereto. For example, in an embodiment of the present inventive concept, the barrier pattern 515 of the first through electrode portion 505a may contact the metal pattern 637c of the contact wiring pattern 637. For example, in an embodiment of the present inventive concept, the barrier pattern 515 of the first through electrode portion 505a may contact the barrier metal layer 637a of the contact wiring pattern 637.

The second through electrode portion 505b of the through electrode structure 505 may pass through a part of the etch stop structure 300. That is, the second through electrode portion 505b may pass through the first etch stop layer 310 and may contact the second etch stop layer 330. Also, a part of the second through electrode portion 505b may surround a part of a side surface of the contact wiring pattern 637. For example, the second through electrode portion 505b may contact the part of the side surface of the contact wiring pattern 637. Accordingly, the through electrode structure 505 and the contact wiring pattern 637 may be electrically connected.

The semiconductor device 30 according to an embodiment of the present inventive concept may include the etch stop structure 300, and thus, the degrees of etching of the semiconductor substrate 110 and the first insulating layer 210 may be finely adjusted in an operation of etching the semiconductor substrate 110 and the first insulating layer 210 for manufacturing the through electrode structure 505. Accordingly, the reliability of a connection structure of the through electrode structure 505 and the contact wiring pattern 637 of the semiconductor device 30 may be enhanced.

Figure 7:
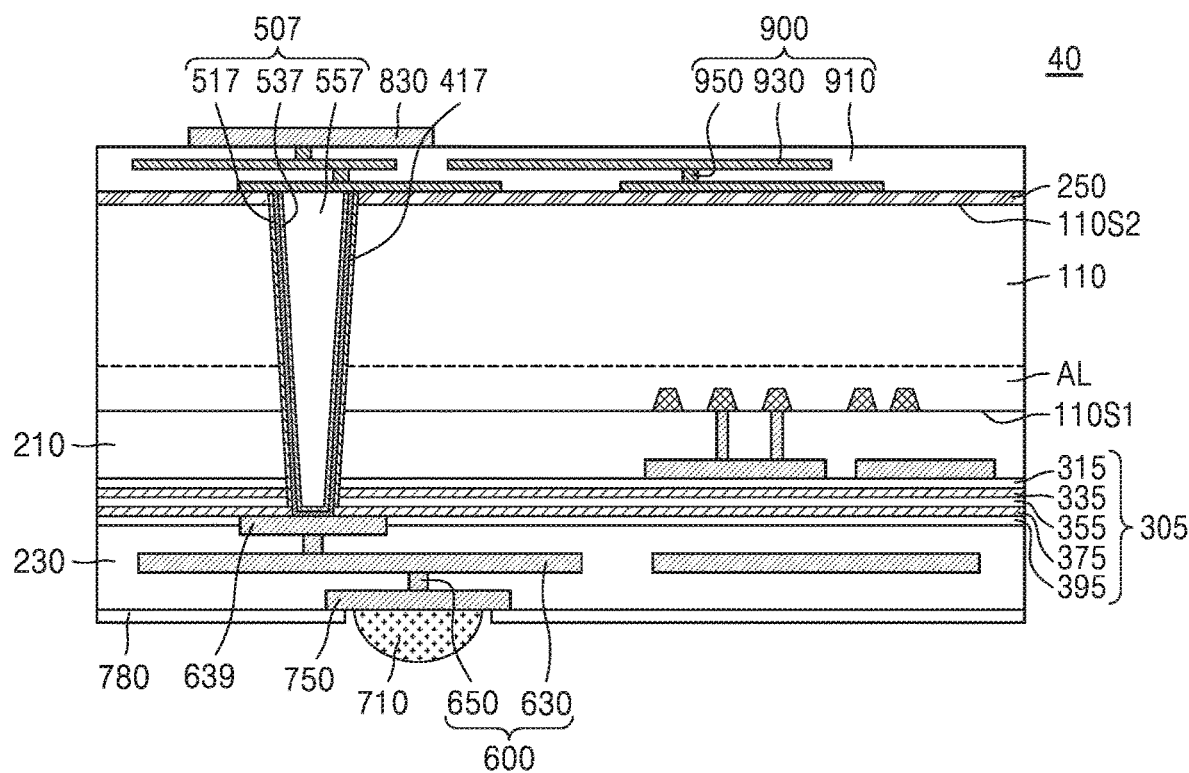
FIG. 7 is a cross-sectional view of a semiconductor device according to an embodiment of the present inventive concept.

FIG. 7 is a cross-sectional view of a semiconductor device 40 according to an embodiment of the present inventive concept.

Hereinafter, redundant descriptions between the semiconductor device 10 of FIG. 1 and the semiconductor device 40 of FIG. 7 are omitted and differences therebetween are mainly described.

The etch stop structure 305 of the semiconductor device 40 according to an embodiment of the present inventive concept may include first to fifth etch stop layers 315, 335, 355, 375, and 395. Although the etch stop structure 305 of FIG. 7 is illustrated as including five etch stop layers, the number of etch stop layers included in the etch stop structure 305 is not limited thereto.

In an embodiment of the present inventive concept, each of the first to fifth etch stop layers 315, 335, 355, 375, and 395 may have a thickness of about 1 nanometer to about 10 nanometers. Also, the etch stop structure 305 may have a structure in which two materials having different etch selectivities are alternately stacked.

The first etch stop layer 315, the third etch stop layer 355, and the fifth etch stop layer 395 may include a material that has a relatively high etch rate in a wet etching process, but has a relatively low etch rate or is not etched in a dry etching process. In addition, materials of the first etch stop layer 315, the third etch stop layer 355, and the fifth etch stop layer 395 may be substantially the same as each other.

The second etch stop layer 335 and the fourth etch stop layer 375 may include a material that has a relatively high etch rate in the dry etching process but has a relatively low etch rate or is not etched in the wet etching process. Also, the material of the second etch stop layer 335 and the fourth etch stop layer 375 may be substantially the same as each other.

In an embodiment of the present inventive concept, a side surface of a contact wiring pattern 639 of the semiconductor device 40 may be surrounded by the fifth etch stop layer 395 and the second insulating layer 230, and an upper surface of the contact wiring pattern 639 may contact the fourth etch stop layer 375 and the through electrode structure 507.

The through electrode structure 507 of the semiconductor device 40 may pass through the semiconductor substrate 110, the first insulating layer 210, and the first to fourth etch stop layers 315, 335, 355, and 375 of the etch stop structure 305 to contact the contact wiring pattern 639. A part of a side surface of the through electrode structure 507 may be surrounded by the first to fourth etch stop layers 315, 335, 355, and 375.

In an embodiment of the present inventive concept, the through electrode structure 507 may include a barrier pattern 517, a seed pattern 537, and a conductive via 557. Also, the separation layer 417 may surround a part of the side surface of the through electrode structure 507. For example, the barrier pattern 517 may be disposed along a surface of the separation layer 417 and configured to contact the contact wiring pattern 639. Also, the separation layer 417 may pass through the first to third etch stop layers 315, 335, and 355 to contact the fourth etch stop layer 375. The separation layer 417 may electrically separate the semiconductor substrate 110 and the through electrode structure 507, and thus may prevent and/or suppress the leakage current of the through electrode structure 507.

The semiconductor device 40 according to an embodiment of the present inventive concept may include the etch stop structure 305, and thus, the degrees of etching of the semiconductor substrate 110 and the first insulating layer 210 need to be finely adjusted in the operation of etching the semiconductor substrate 110 and the first insulating layer 210 for manufacturing the through electrode structure 507. Accordingly, the reliability of a connection structure of the through electrode structure 507 and the contact wiring pattern 639 of the semiconductor device 40 may be enhanced.

Figure 8:
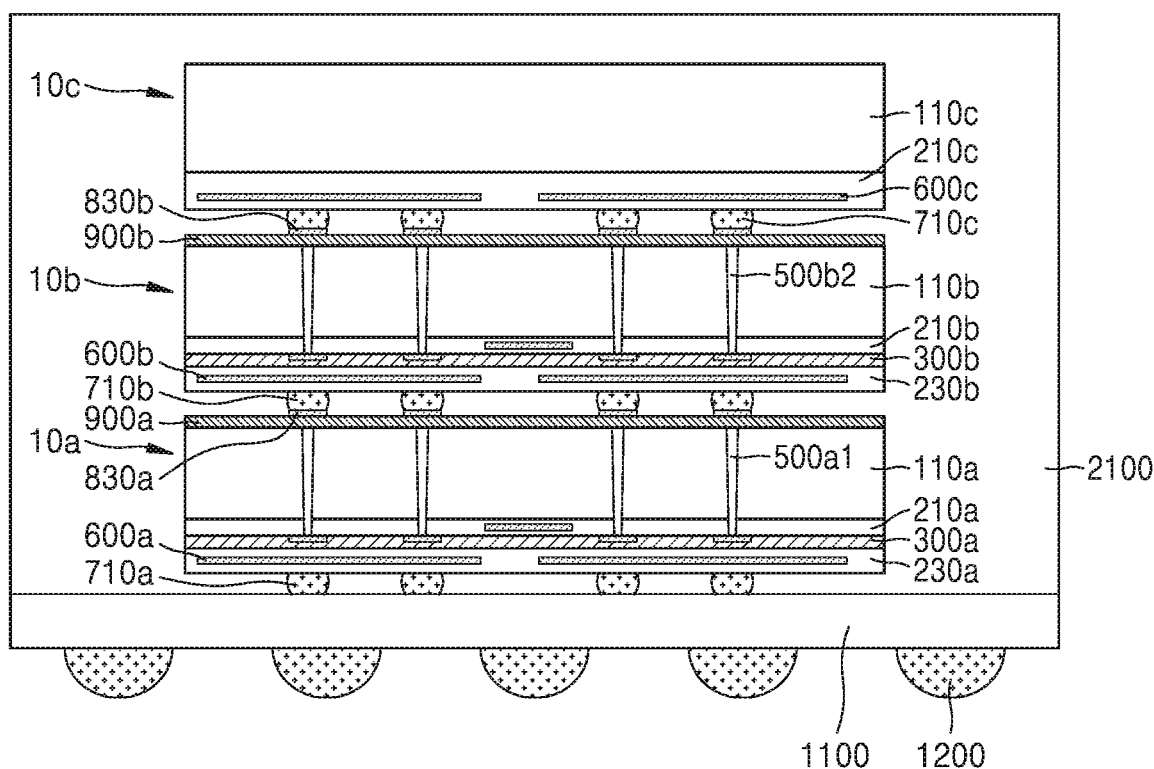
FIG. 8 is a cross-sectional view of a semiconductor package according to an embodiment of the present inventive concept.

FIG. 8 is a cross-sectional view of a semiconductor package 1 according to an embodiment of the present inventive concept.

Referring to FIG. 8, the semiconductor package 1 according to an embodiment of the present inventive concept may include a first semiconductor device 10a, a second semiconductor device 10b, a third semiconductor device 10c, a package substrate 1100, an external connection terminal 1200, and a molding layer 2100.

Although the semiconductor package 1 according to the present embodiment is illustrated as including three semiconductor devices, for example, first, second, and third semiconductor devices 10a, 10b, and 10c, the number of semiconductor devices included in the semiconductor package 1 is not limited as described above.

The package substrate 1100 may be a substrate on which the first to third semiconductor devices 10a, 10b, and 10c are mounted. For example, the package substrate 1100 may include a printed circuit board or a redistribution layer. In addition, the external connection terminal 1200 may be disposed on a lower portion of the package substrate 1100 to be electrically connected to wiring patterns in the package substrate 1100.

The first semiconductor device 10a and the second semiconductor device 10b may be substantially the same as at least one of the semiconductor devices 10, 20, 30, or 40 described with reference to FIGS. 1 to 7. For example, the first semiconductor device 10a and the second semiconductor device 10b may include semiconductor substrates 110a and 110b, first insulating layers 210a and 210b, second insulating layers 230a and 230b, etch stop structures 300a and 300b, through electrode structures 500a1 and 500b2, lower wiring patterns 600a and 600b, connection terminals 710a and 710b, upper wiring structures 900a and 900b, and conductive pads 830a and 830b. The etch stop structure 300a of the first semiconductor device 10a and the etch stop structure 300b of the second semiconductor device 10b may each be substantially the same as the etch stop structure 300 described with reference to FIGS. 1 to 6, or the etch stop structure 305 described with reference to FIG. 7. The through electrode structure 500a1 of the first semiconductor device 10a and the through electrode structure 500b2 of the second semiconductor device 10b may each be substantially the same as the through electrode structure 500 described with reference to FIGS. 1 to 4, the through electrode structure 505 described with reference to FIGS. 5 to 6, or the through electrode structure 507 described with reference to FIG. 7. Also, the third semiconductor device 10c may include a semiconductor substrate 110c, a first insulating layer 210c, a lower wiring pattern 600c, and a connection terminal 710c.

The first semiconductor device 10a may be mounted on the package substrate 1100. The connection terminal 710a of the first semiconductor device 10a may be interposed between the semiconductor substrate 110a and the package substrate 1100 to electrically connect the first semiconductor device 10a to the package substrate 1100.

The second semiconductor device 10b may be mounted on the first semiconductor device 10a. The connection terminal 710b of the second semiconductor device 10b may be interposed between the semiconductor substrate 110a of the first semiconductor device 10a and the semiconductor substrate 110b of the second semiconductor device 10b to electrically connect the first semiconductor device 10a to the second semiconductor device 10b.

The third semiconductor device 10c may be mounted on the second semiconductor device 10b. The connection terminal 710c of the third semiconductor device 10c may be interposed between the semiconductor substrate 110b of the second semiconductor device 10b and the semiconductor substrate 110c of the third semiconductor device 10c to electrically connect the second semiconductor device 10b to the third semiconductor device 10c.

The third semiconductor device 10c may not include a through electrode structure and an etch stop structure.

The molding layer 2100 may cover the first to third semiconductor devices 10a, 10b, and 10c on the package substrate 1100. In an embodiment of the present inventive concept, the molding layer 2100 may include a material of an epoxy molding compound (EMC). However, the material of the molding layer 2100 is not limited to the above-described epoxy molding compound (EMC), and may include various materials, for example, an epoxy-based material, a thermosetting material, a thermoplastic material, a UV treatment material, etc.

Since, the first semiconductor device 10a and the second semiconductor device 10b may include etch stop structures 300a and 300b to form reliable connection structures of through electrode structures 500a1 and 500b2 and lower wiring patterns 600a and 600b, respectively, the semiconductor package 1 fabricated may have a reliable structure.

In an embodiment of the present inventive concept, unlike illustrated in FIG. 8, the semiconductor package 1 may include only the first semiconductor device 10a. In other words, the semiconductor package 1 may include only one semiconductor device, for example, the first semiconductor device 10a.

In an embodiment of the present inventive concept, the semiconductor device 10a included in the semiconductor package 1 may include the lower wiring line pattern 630, the upper wiring line pattern 930, and the through electrode structure 500 connecting the lower wiring line pattern 630 to the upper wiring line pattern 930.

When the semiconductor package 1 includes one semiconductor device 10a, the lower wiring line pattern 630 provided on a lower portion of the semiconductor device 10a may be configured to transmit a data signal and/or a control signal, and the upper wiring line pattern 930 provided on an upper portion of the semiconductor device 10a may be configured to transmit a power signal. However, the present inventive concept is not limited thereto, and the lower wiring line pattern 630 provided on the lower portion of the semiconductor device 10a may be configured to transmit a power signal, and the upper wiring line pattern 930 provided on the upper portion of the semiconductor device 10a may be configured to transmit a data signal and/or a control signal.

FIGS. 9A to 9J are diagrams illustrating operations of a method of manufacturing the semiconductor device 20 according to an embodiment of the present inventive concept.

Hereinafter, the method of manufacturing the semiconductor device 20 according to an embodiment of the present inventive concept will be described with reference to FIGS. 9A to 9J. The method of manufacturing the semiconductor device 20 according to the present embodiment may be the method of manufacturing the semiconductor device 20 of FIG. 4.

Figure 9A:
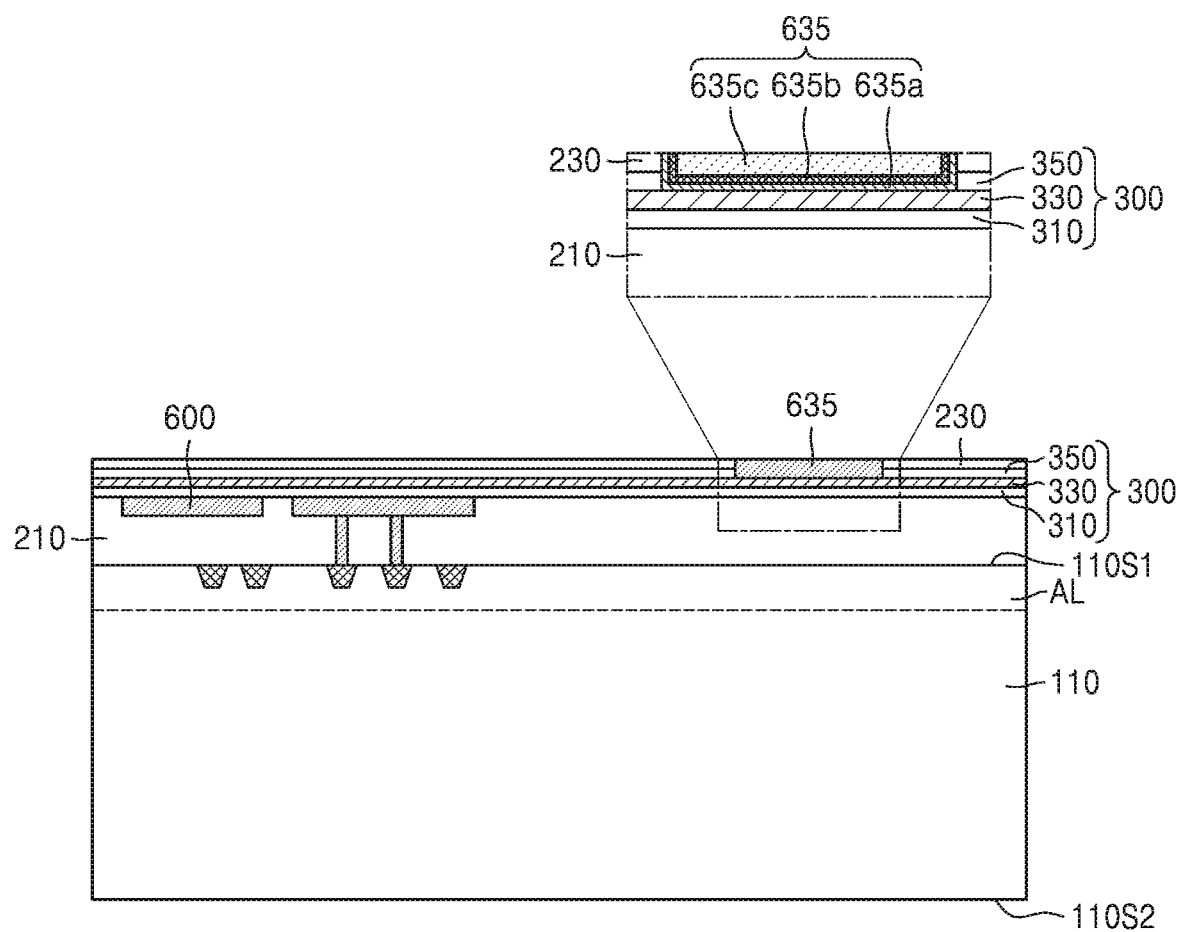
FIGS. 9A to 9J are diagrams illustrating operations of a method of manufacturing a semiconductor device according to an embodiment of the present inventive concept.

Referring to FIG. 9A, the first insulating layer 210, the etch stop structure 300, and the second insulating layer 230 may be sequentially stacked on the first surface 110S1 of the semiconductor substrate 110.

The contact wiring pattern 635 may be formed in the second insulating layer 230 through a photolithography process and an etching process. For example, in the photolithography process, a mask pattern may be formed to have an opening to define an area of the second insulating layer 230 to be etched. For example, in the etching process of the second insulating layer 230 to form the contact wiring pattern 635, the third etch stop layer 350 of the etch stop structure 300 may function as a stopper layer.

A part of the second insulating layer 230 may be removed by a dry etching process until the third etch stop layer 350 is exposed. Also, the third etch stop layer 350 may be removed by a wet etching process for cleaning the surface of the second insulating layer 230.

The etch stop structure 300 may be used in an operation of forming the contact wiring pattern 635 so that the contact wiring pattern 635 may form a separation distance having a relatively uniform size from the first surface 110S1 of the semiconductor substrate 110 in the vertical direction.

The contact wiring pattern 635 may be formed through operations of forming the barrier metal layer 635a on the surface of the second insulating layer 230 and the surface of the second etch stop layer 330, forming the seed metal layer 635b on the barrier metal layer 635a, and forming the metal pattern 635c in a concave space formed by the barrier metal layer 635a and the seed metal layer 635b. For example, after the part of the second insulating layer 230 is removed by a dry etching process and the third etch stop layer 350 is removed by a wet etching process, a trench may be formed. The barrier metal layer 635a may be formed in the trench to conformally cover the bottom and sidewalls of the trench. The seed metal layer 635b may be conformally formed on the barrier metal layer 635a. By performing an electroplating process using the seed metal layer 635b as an electrode, the metal pattern 635c may be formed on the seed metal layer 635b. An etching process or a planarization process may then be performed to remove the barrier metal layer 635a, the seed metal layer 635b and the metal pattern 635c on top of the second insulating layer 230.

Figure 9B:
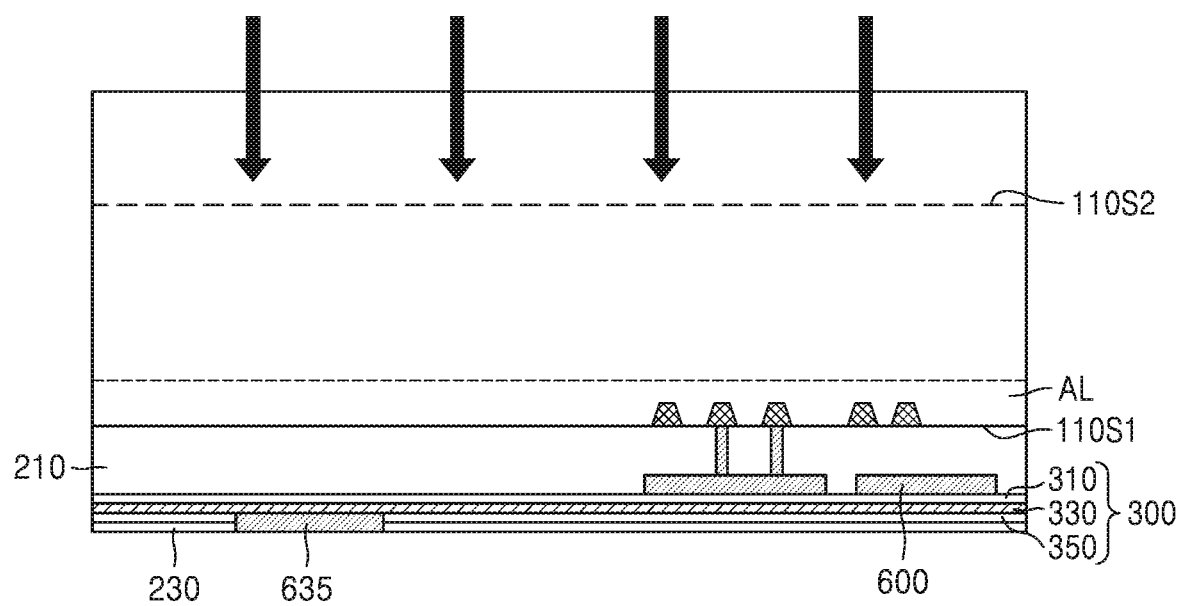

Referring to FIG. 9B, the semiconductor substrate 110 may be turned over where the second surface 110S2 of the semiconductor substrate 110 faces upward. Thereafter, a part of the semiconductor substrate 110 may be removed so that the semiconductor substrate 110 may be thin. For example, thinning the semiconductor substrate 110 may include performing a planarization process on the second surface 110S2 of the semiconductor substrate 110. The planarization process may be a chemical mechanical polishing (CMP) process.

Figure 9C:
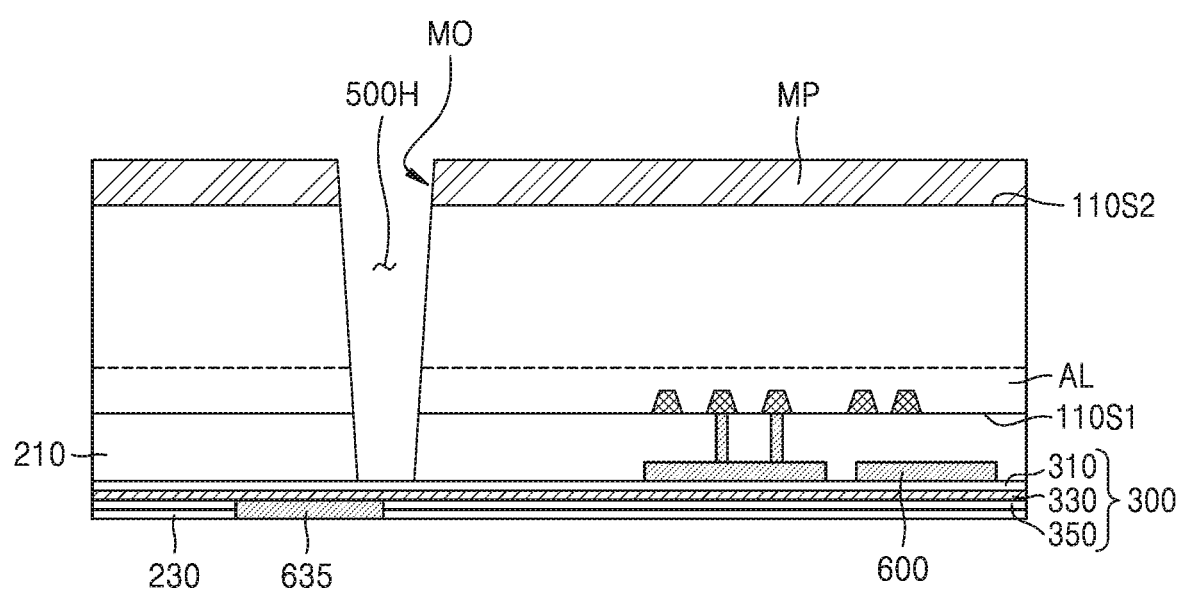

Referring to FIG. 9C, a mask pattern MP may be formed on the second surface 110S2 of the semiconductor substrate 110. In an embodiment of the present inventive concept, the mask pattern MP may include a carbon-containing material such as a spin on carbon hard mask (SOC) material.

The mask pattern MP may include a mask opening MO formed by a photolithography process. The mask opening MO may expose the second surface 110S2 of the semiconductor substrate 110.

An operation of etching the semiconductor substrate 100 and forming the through hole 500H may be performed. In an embodiment of the present inventive concept, the through hole 500H may be formed through an operation of etching the second surface 110S2 of the semiconductor substrate 110 exposed through the mask opening MO of the mask pattern MP. For example, an etching process may be a dry etching process using a fluorine-containing gas.

In an embodiment of the present inventive concept, the first etch stop layer 310 of the etch stop structure 300 may have a relatively low etch rate or may not be etched in the dry etching process. Accordingly, after the etching process of the semiconductor substrate 110 and the first insulating layer 210 is completed, the through hole 500H may expose an upper surface of the first etch stop layer 310. Depending on the etching condition, the through hole 500H may or may not have vertical sidewalls having a right angle with the upper surface of the first etch stop layer 310. In an embodiment of the present inventive concept, the through hole 500H may have a tapered shape where the cross-sectional area of the through hole 500H in the horizontal direction decreases toward the contact wiring pattern 635.

Figure 9D:
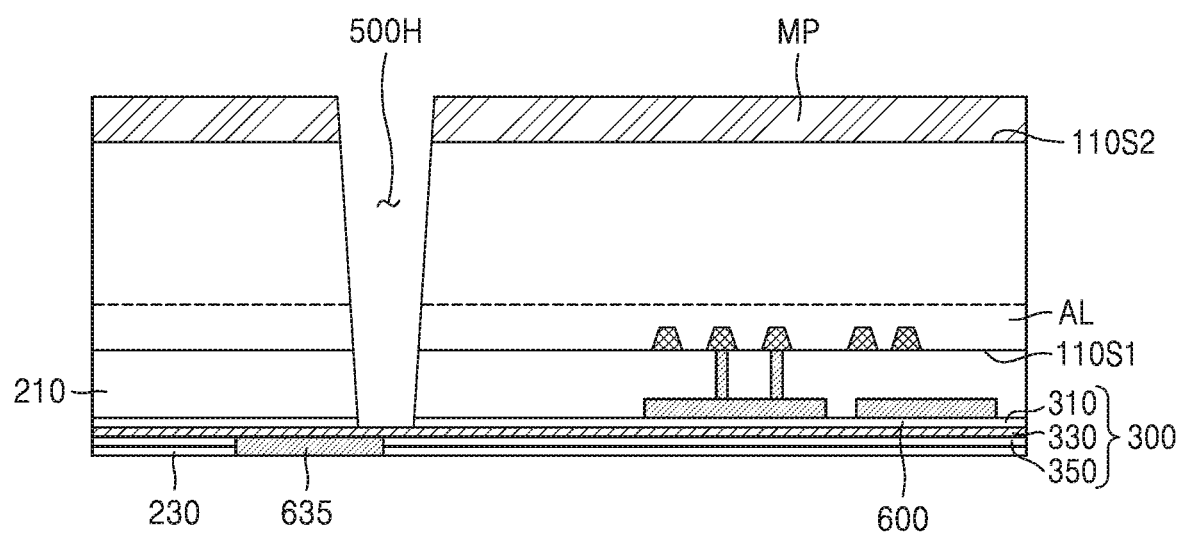

Referring to FIG. 9D, an operation of cleaning the surface of the through hole 500H may be performed. In an embodiment of the present inventive concept, an operation of cleaning an inner surface of the semiconductor substrate 110 and an inner surface of the first insulating layer 210 defining the through hole 500H through a wet etching process may be performed. For example, an etching process may be a wet etching process using an etchant such as an ammonium-containing material.

In an embodiment of the present inventive concept, the first etch stop layer 310 of the etch stop structure 300 may have a relatively high etch rate in the wet etching process. Also, the second etch stop layer 330 of the etch stop structure 300 may have a relatively low etch rate or may not be etched in the wet etching process. Accordingly, in the operation of cleaning the semiconductor substrate 110 and the first insulating layer 210, the first etch stop layer 310 may be removed, and the through hole 500H may expose the upper surface of the second etch stop layer 330.

The semiconductor device 20 according to an embodiment of the inventive concept may include the etch stop structure 300, and thus, the degrees of etching of the semiconductor substrate 110 and the first insulating layer 210 may be finely adjusted in the operation of etching the semiconductor substrate 110 and the first insulating layer 210 and forming the through hole 500H. Accordingly, the reliability of a connection structure of the through electrode structure 500 and the contact wiring pattern 635 of the semiconductor device 10 may be enhanced.

Figure 9E:
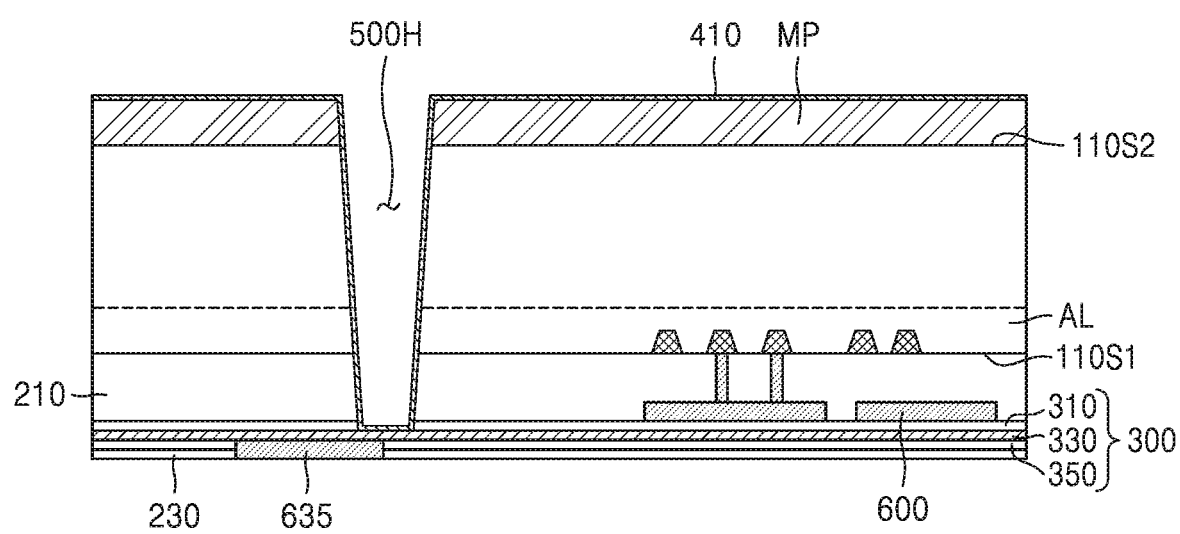

Referring to FIG. 9E, the separation layer 410 may be formed in the through hole 500H. For example, the separation layer 410 may conformally cover an upper surface of the mask pattern MP and bottom and side surfaces of the through hole 500H. Also, the separation layer 410 may cover the second etch stop layer 330 of the etch stop structure 300 exposed by the through hole 500H.

Figure 9F:
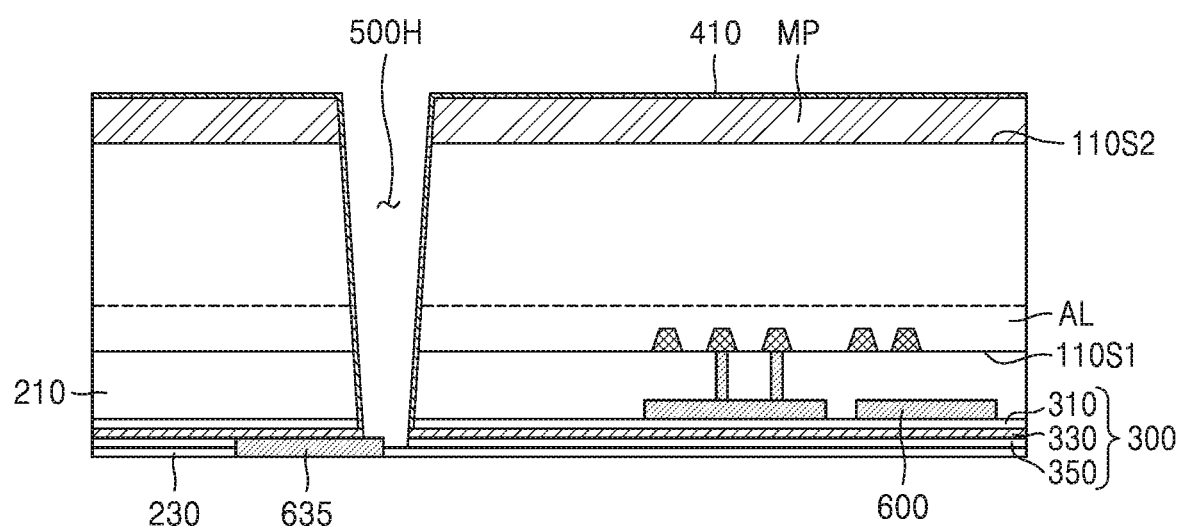

Referring to FIG. 9F, an operation of exposing the contact wiring pattern 635 may be performed through an etching process. The etching process may include an operation of removing the separation layer 410 and the second etch stop layer 330 through the dry etching process, and an operation of removing the third etch stop layer 350 through the wet etching process.

In the operation of removing the separation layer 410 and the second etch stop layer 330 exposed by the through hole 500H through the dry etching process, the third etch stop layer 350 may function as a stopper layer. Accordingly, in the operation of exposing the contact wiring pattern 635 through the etching process, a physical damage to the contact wiring pattern 635 may be prevented. In this etching process, the separation layer 410 on top of the mask pattern MP may also be removed, or may have its thickness significantly reduced.

Figure 9G:
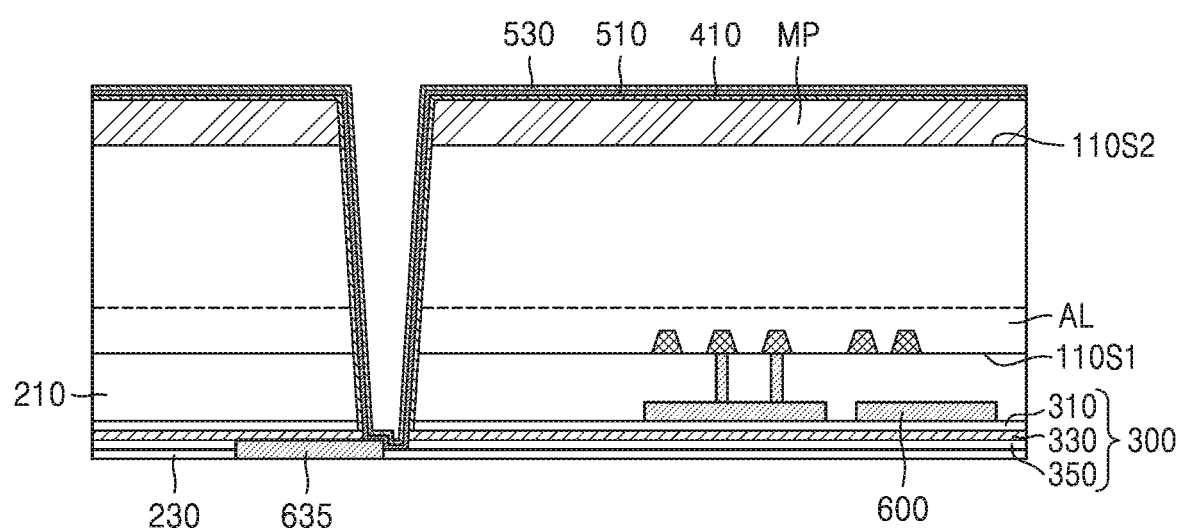

Referring to FIG. 9G, an operation of forming the barrier pattern 510 and the seed pattern 530 may be performed. The barrier pattern 510 may be formed on the surface of the separation layer 410 and the bottom and side surfaces of the through hole 500H. For example, the barrier pattern 510 may be formed on the surface of the separation layer 410, the surface of the second etch stop layer 330 exposed by the through hole 500H, the surface of the third etch stop layer 350 and the surface of the contact wiring pattern 635.

In an embodiment of the present inventive concept, the barrier pattern 510 may be formed by a deposition process, and may conformally cover the bottom and side surfaces of the through hole 500H. The barrier pattern 510 may be formed by, for example, a chemical vapor deposition (CVD) process, a physical vapor deposition (PVD), an atomic layer deposition (ALD), or any other suitable deposition process. The barrier pattern 510 may be spaced apart from the semiconductor substrate 110 by the above-described separation layer 410 in a horizontal direction.

In an embodiment of the present inventive concept, the seed pattern 530 may be conformally formed on the surface of the barrier pattern 510. The seed pattern 530 may be formed by, for example, a chemical vapor deposition (CVD) process, a physical vapor deposition (PVD) process, an atomic layer deposition (ALD), or any other suitable deposition process.

Figure 9H:
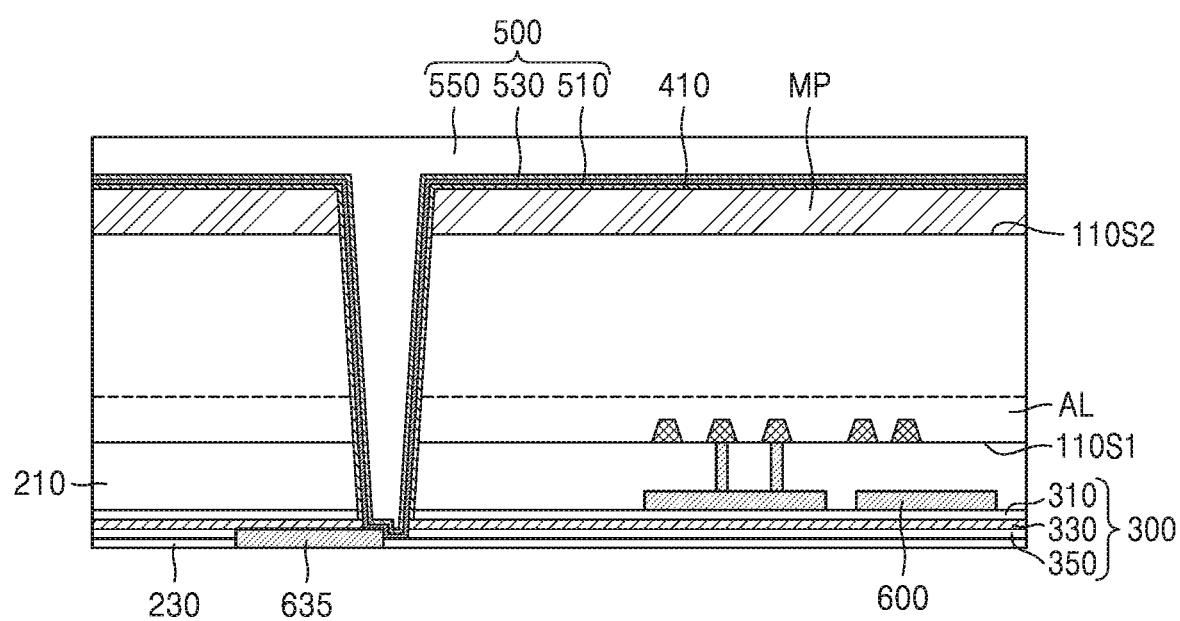

Referring to FIG. 9H, an operation of forming the conductive via 550 may be performed. The conductive via 550 may be formed through an electroplating process using the seed pattern 530 as an electrode. The conductive via 550 may be filled in the inside of the through hole 500H through the electroplating process.

Through the manufacturing process of FIGS. 9G and 9H, the through electrode structure 500 according to an embodiment of the present inventive concept may be manufactured.

Accordingly, the through electrode structure 500 may include the barrier pattern 510, the seed pattern 530, and the conductive via 550.

Figure 9I:
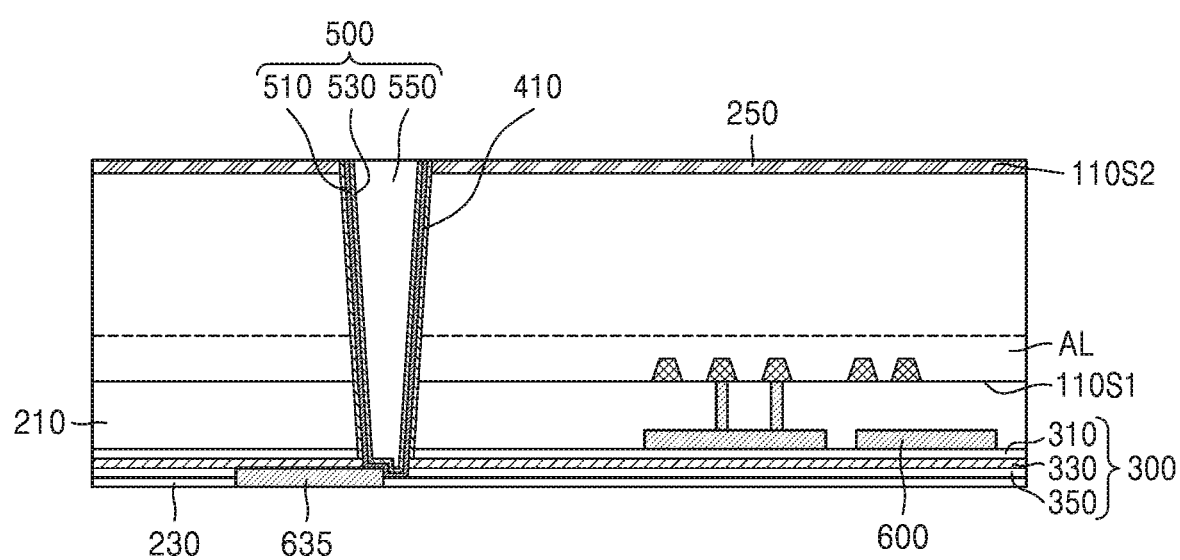

Referring to FIG. 9I, an operation of removing the mask pattern MP, the separation layer 410, the barrier pattern 510, the seed pattern 530, and a part of the conductive via 550 disposed on the second surface 110S2 of the semiconductor substrate 110 may be performed.

In an embodiment of the present inventive concept, the mask pattern MP, the separation layer 410, the barrier pattern 510, the seed pattern 530, and the conductive via 550 may be removed through a planarization process. The planarization process may include a chemical mechanical polishing (CMP) process. In addition, the barrier pattern 510, the seed pattern 530, and the conductive via 550 removed through the planarization process may form the through electrode structure 500. That is, the through electrode structure 500 may include the barrier pattern 510, the seed pattern 530, and the conductive via 550 remaining after the planarization process.

The mask pattern MP remaining after the planarization process may form the above-described third insulating layer 250. However, the present inventive concept is not limited thereto, and the planarization process may be performed until the second surface 110S2 of the semiconductor substrate 110 is exposed.

Figure 9J:
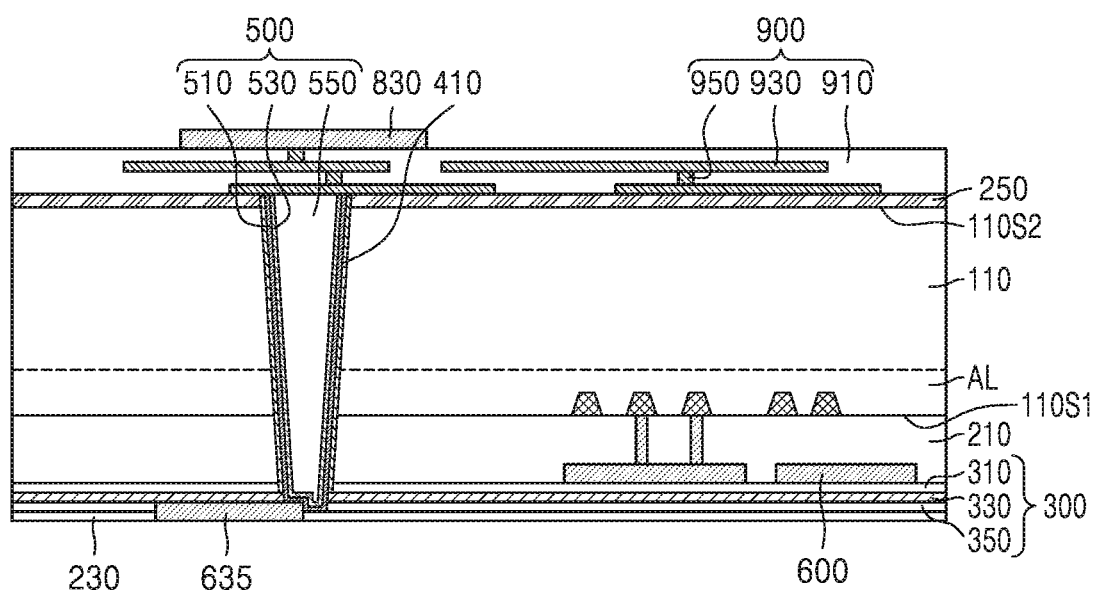

Referring to FIG. 9J, an operation of forming the upper wiring structure 900 on the upper surface of the third insulating layer 250 and the upper surface of the through electrode structure 500 may be performed. For example, the operation of forming the upper wiring structure 900 may include an operation of forming the upper wiring insulating layer 910 on the third insulating layer 250, and an operation of patterning the upper wiring insulating layer 910 and forming the upper wiring line pattern 930 and the upper wiring via pattern 950. The upper wiring line pattern 930 may include two or more layers extending in the horizontal direction. The upper wiring via pattern 950 may extend in the vertical direction inside the upper wiring insulating layer 910 to interconnect the plurality of upper wiring line patterns 930.

An operation of forming the conductive pad 830 on the upper wiring structure 900 may be additionally performed. The conductive pad 830 may be electrically connected to the through electrode structure 500 through the upper wiring structure 900. For example, the conductive pad 830 may contact a part of the upper wiring via pattern 950, and may be electrically connected to the through electrode structure 500 via the upper wiring via pattern 950 and the upper wiring line pattern 930.

As described above, the manufacturing of the semiconductor device 20 according to an embodiment of the present inventive concept may be completed.

FIGS. 10A to 10J are diagrams illustrating operations of a method of manufacturing a semiconductor device 30 according to an embodiment of the present inventive concept.

Hereinafter, the method of manufacturing the semiconductor device 30 according to an embodiment of the present inventive concept will be described with reference to FIGS. 10A to 10J. The method of manufacturing the semiconductor device 30 according to the present embodiment may be the manufacturing method of the semiconductor device 30 of FIG. 5.

Hereinafter, redundant descriptions between method of manufacturing the semiconductor device 30 and the method of manufacturing the semiconductor device 20 described with reference to FIGS. 9A to 9J are omitted, and differences therebetween are mainly described.

Figure 10A:
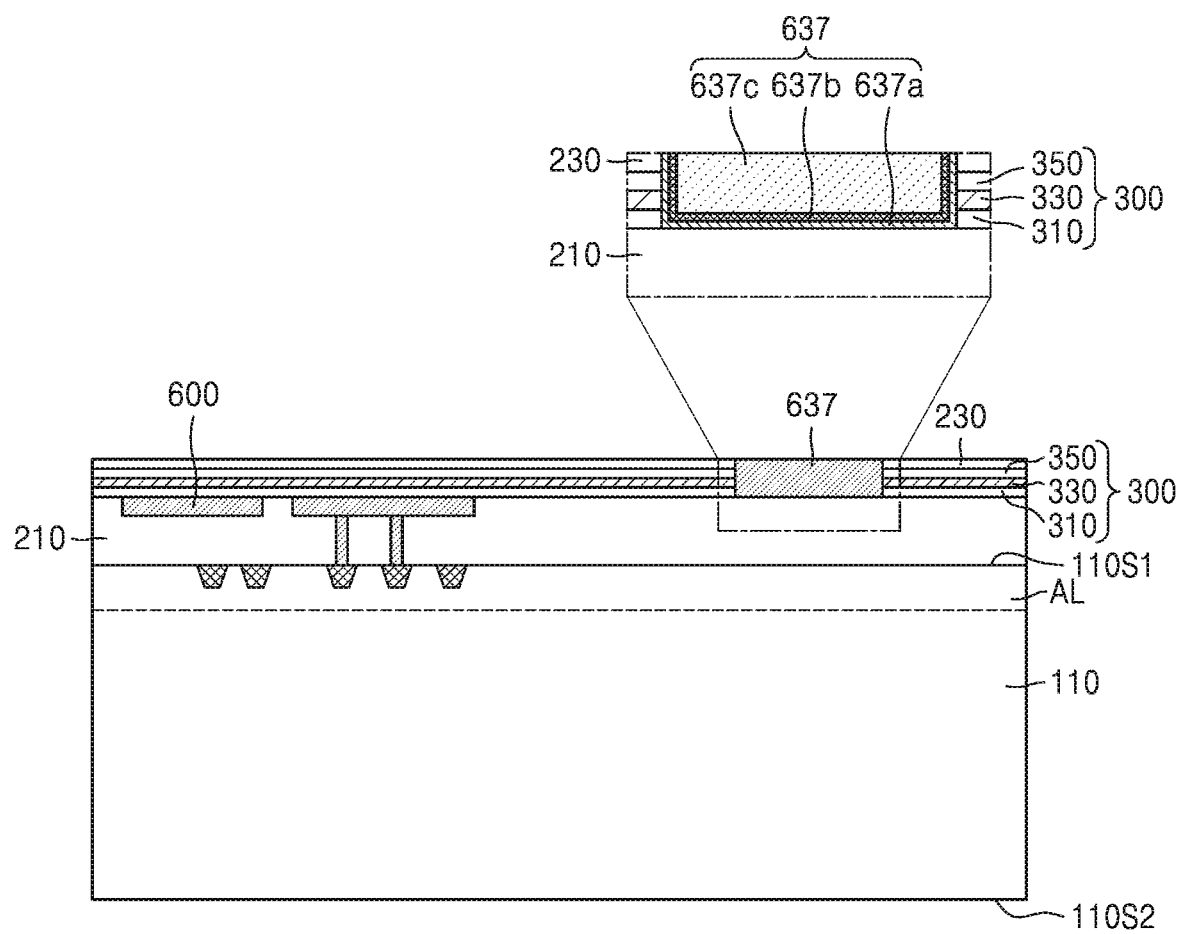
FIGS. 10A to 10J are diagrams illustrating operations of a method of manufacturing a semiconductor device according to an embodiment of the present inventive concept.

Referring to FIG. 10A, the first insulating layer 210, the etch stop structure 300, and the second insulating layer 230 may be sequentially stacked on the first surface 110S1 of the semiconductor substrate 110.

The contact wiring pattern 637 may be formed in the second insulating layer 230 through a photolithography process and an etching process. For example, in the photolithography process, a mask pattern may be formed to have an opening to define an area of the second insulating layer 230 to be etched. For example, in the etching process of the second insulating layer 230 to form the contact wiring pattern 637, the first etch stop layer 310 of the etch stop structure 300 may function as a stopper layer.

The second insulating layer 230, the third etch stop layer 350, and the second etch stop layer 330 may be removed by a dry etching process until the first etch stop layer 310 is exposed. Also, the first etch stop layer 310 may be removed by a wet etching process for cleaning the surface of the second insulating layer 230.

The etch stop structure 300 may be used in an operation of forming the contact wiring pattern 637 so that the contact wiring pattern 637 may form a separation distance having a relatively uniform size from the first surface 110S1 of the semiconductor substrate 110 in the vertical direction.

The contact wiring pattern 637 may be formed through operations of forming the barrier metal layer 637a on the surface of the second insulating layer 230, the surface of the etch stop structure 300 and the surface of the first insulating layer 210, forming the seed metal layer 637b on the barrier metal layer 637a, and forming the metal pattern 637c in a concave space formed by the barrier metal layer 637a and the seed metal layer 637b. For example, after the second insulating layer 230, the third etch stop layer 350, the second etch stop layer 330 and the first etch stop layer 310 are removed by alternately applying a dry etching process and a wet etching process, a trench may be formed. The barrier metal layer 637a may be formed in the trench to conformally cover the bottom and sidewalls of the trench. The seed metal layer 637b may be formed on the barrier metal layer 637a. By performing an electroplating process using the seed metal layer 637b as an electrode, the metal pattern 637c may be formed on the seed metal layer 637b. An etching process or a planarization process may then be performed to remove the barrier metal layer 637a, the seed metal layer 637b and the metal pattern 637c on top of the second insulating layer 230.

Figure 10B:
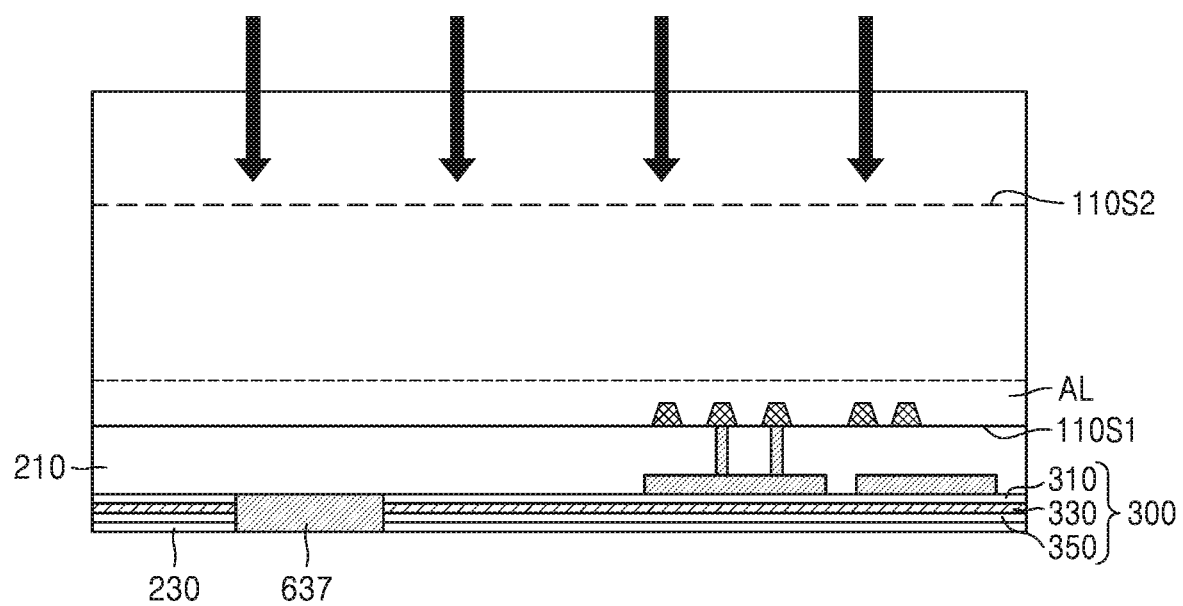

Referring to FIG. 10B, the semiconductor substrate 110 may be turned over so that the second surface 110S2 of the semiconductor substrate 110 faces upward. Thereafter, a part of the semiconductor substrate 110 may be removed so that the semiconductor substrate 110 may be thin.

Figure 10C:
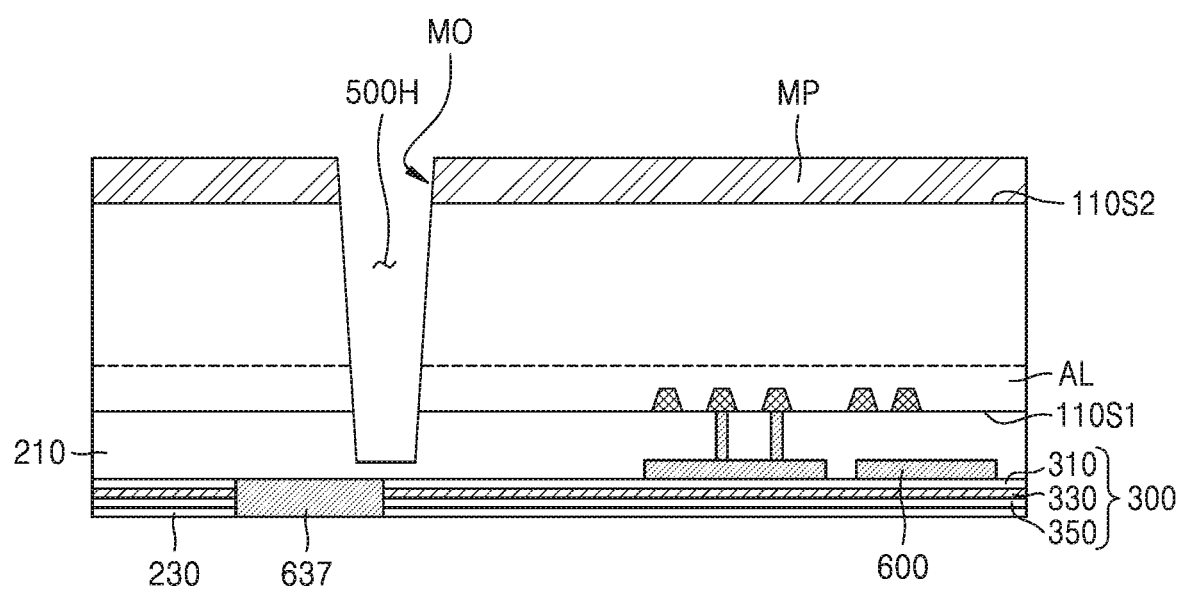

Referring to FIG. 10C, the mask pattern MP may be formed on the second surface 110S2 of the semiconductor substrate 110. In an embodiment of the present inventive concept, the mask pattern MP may include a carbon-containing material such as a SOC material.

The mask pattern MP may include the mask opening MO formed by a photolithography process. The mask opening MO may expose the second surface 110S2 of the semiconductor substrate 110.

An operation of etching the semiconductor substrate 110 and forming the through hole 505H may be performed. In an embodiment of the present inventive concept, the through hole 505H may be formed through an operation of etching the second surface 110S2 of the semiconductor substrate 110 exposed through the mask opening MO of the mask pattern MP. For example, an etching process may be a dry etching process using a fluorine-containing gas.

In an embodiment of the present inventive concept, the etch stop structure 300 may not be etched in the etching process. In other words, the through hole 505H generated by the etching process may not expose the etch stop structure 300. For example, the through hole 505H may pass through the first surface 110S1 and the second surface 110S2 of the semiconductor substrate 110, and an upper surface of the first insulating layer 210. However, the through hole 505H may not pass through a lower surface of the first insulating layer 210.

Figure 10D:
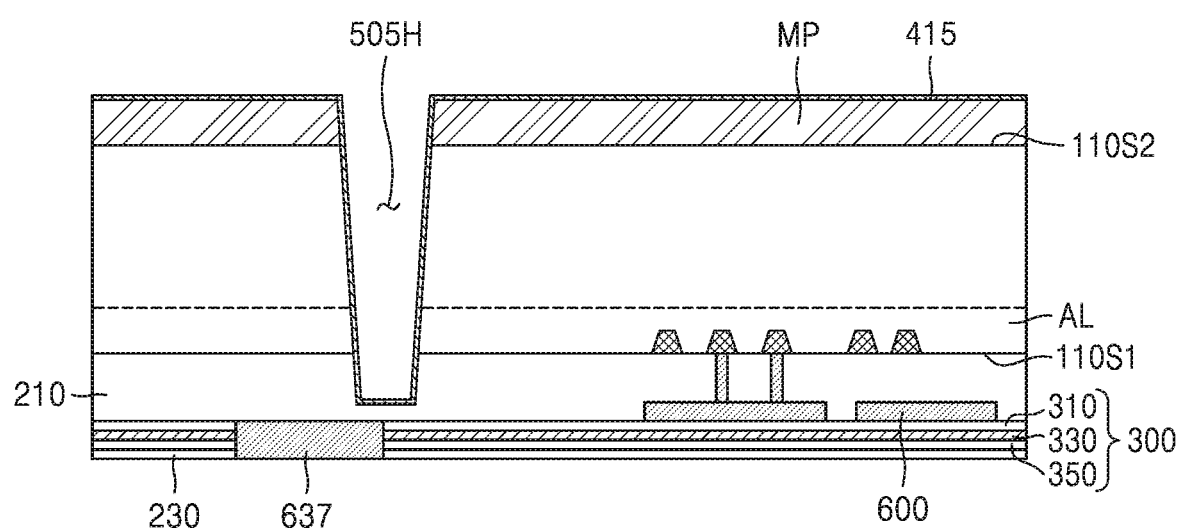

Referring to FIG. 10D, the separation layer 415 may be formed in the through hole 505H. For example, the separation layer 415 may conformally cover the top surface of the mask pattern MP and bottom and side surfaces of the through hole 505H. For example, the separation layer 415 may cover one surface of the first insulating layer 210 exposed by the through hole 505H.

Figure 10E:
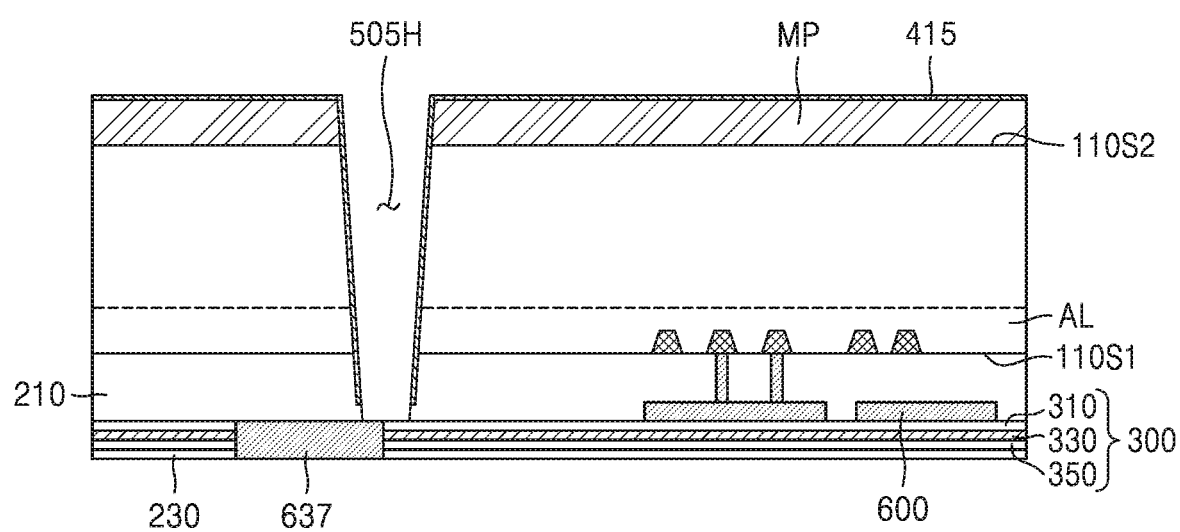

Referring to FIG. 10E, an operation of etching the first insulating layer 210 and exposing the contact wiring pattern 637 may be performed. A portion of the separation layer 415 exposed on the bottom of the through hole 505H may be etched away first before the first insulating layer 210 under the through hole 505H is etched. For example, the etching process may be a dry etching process using a fluorine-containing gas.

In an embodiment of the present inventive concept, the first etch stop layer 310 of the etch stop structure 300 may have a relatively low etch rate or may not be etched in the dry etching process. Accordingly, after the operation of etching the first insulating layer 210 and exposing the contact wiring pattern 637, the through hole 505H may expose an upper surface of the first etch stop layer 310.

In an embodiment of the present inventive concept, an etching process of exposing the contact wiring pattern 637 may be performed after the operation of forming the separation layer 415, and thus a length of the separation layer 415 in the vertical direction may be smaller than a length of the through hole 505H exposing the contact wiring pattern 637 in the vertical direction.

Figure 10F:
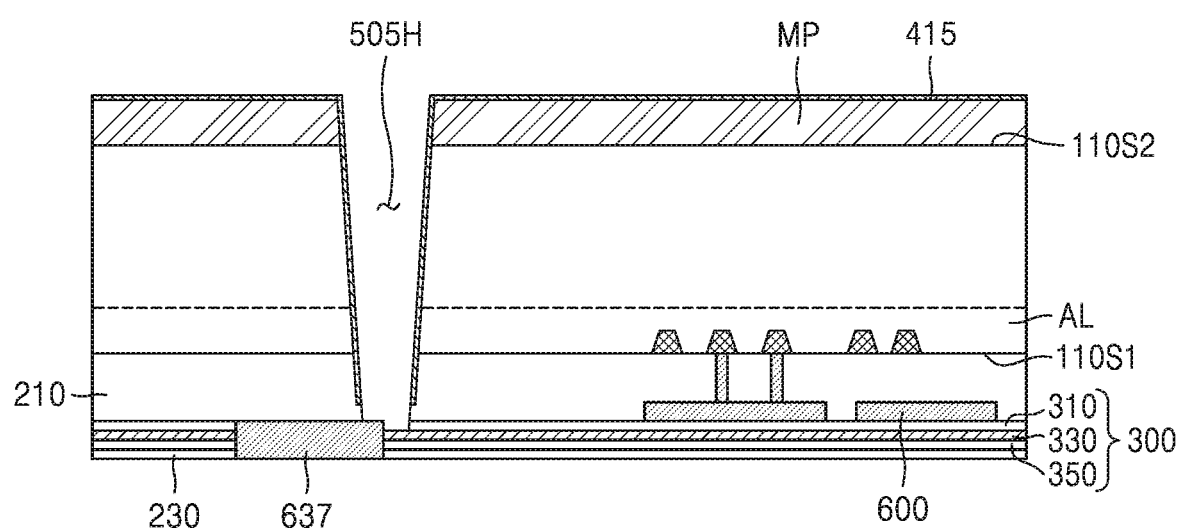

Referring to FIG. 10F, an operation of cleaning the surface of the through hole 505H may be performed. In an embodiment of the present inventive concept, the operation of cleaning an inner surface of the semiconductor substrate 110 and an inner surface of the first insulating layer 210 defining the through hole 505H through a wet etching process may be performed. For example, the etching process may be a wet etching process using an etchant such as an ammonium-containing material.

In an embodiment of the present inventive concept, the first etch stop layer 310 of the etch stop structure 300 may have a relatively high etch rate in the wet etching process. Also, the second etch stop layer 330 of the etch stop structure 300 may have a relatively low etch rate or may not be etched in the wet etching process.

In the operation of cleaning the semiconductor substrate 110 and the first insulating layer 210, the first etch stop layer 310 may be removed, and the through hole 505H may expose the upper surface of the second etch stop layer 330. Accordingly, a step may be generated in a lower portion of the through hole 505H adjacent to the contact wiring pattern 637.

Figure 10G:
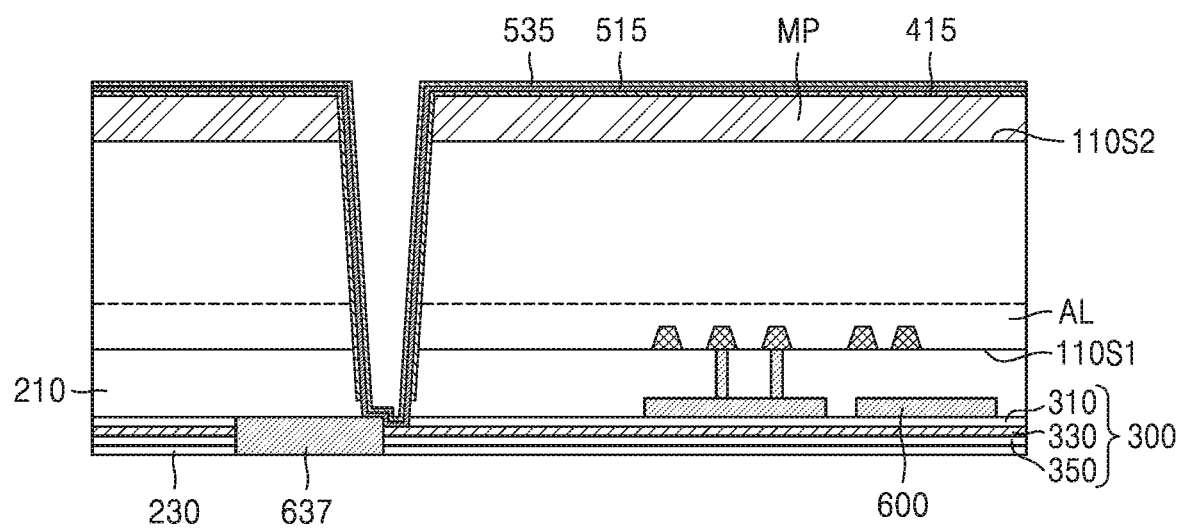

Referring to FIG. 10G, an operation of forming the barrier pattern 515 and the seed pattern 535 may be performed. The barrier pattern 515 may be conformally formed on the surface of the separation layer 415 and the bottom and side surfaces of the through hole 505H. For example, the barrier pattern 515 may be formed on the surface of the separation layer 415, the surface of the second etch stop layer 330 exposed by the through hole 505H, the surface of the first etch stop layer 310, the surface of the first insulating layer 210 and the surface of the contact wiring pattern 637.

In an embodiment of the present inventive concept, the barrier pattern 515 may be formed by a deposition process, and may conformally cover the bottom and side surfaces of the through hole 505H. The barrier pattern 515 may be formed by, for example, a chemical vapor deposition (CVD) process, a physical vapor deposition (PVD) process, an atomic layer deposition (ALD), or any other suitable deposition process. The barrier pattern 515 may be spaced apart from the semiconductor substrate 110 in the horizontal direction by the above-described separation layer 415.

In an embodiment of the present inventive concept, the seed pattern 535 may be conformally formed on the surface of the barrier pattern 515. The seed pattern 535 may be formed by, for example, a chemical vapor deposition (CVD) process, a physical vapor deposition (PVD) process, an atomic layer deposition (ALD) process, or any other suitable deposition process.

Figure 10H:
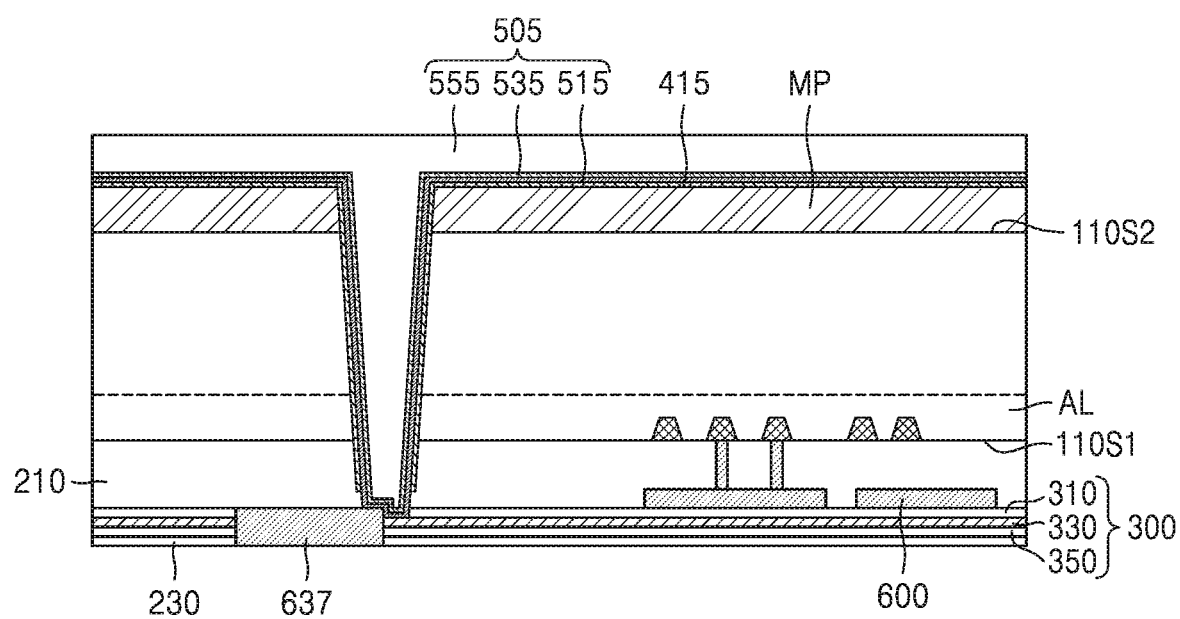

Referring to FIG. 10H, an operation of forming the conductive via 555 may be performed. The conductive via 555 may be formed through an electroplating process using the seed pattern 535 as an electrode. The conductive via 555 may be filled in the inside of the through hole 505H through the electroplating process.

Through the manufacturing process of FIGS. 10 and 10H, the through electrode structure 505 according to an embodiment of the present inventive concept may be manufactured. Accordingly, the through electrode structure 505 may include the barrier pattern 515, the seed pattern 535, and the conductive via 555.

Figure 10I:
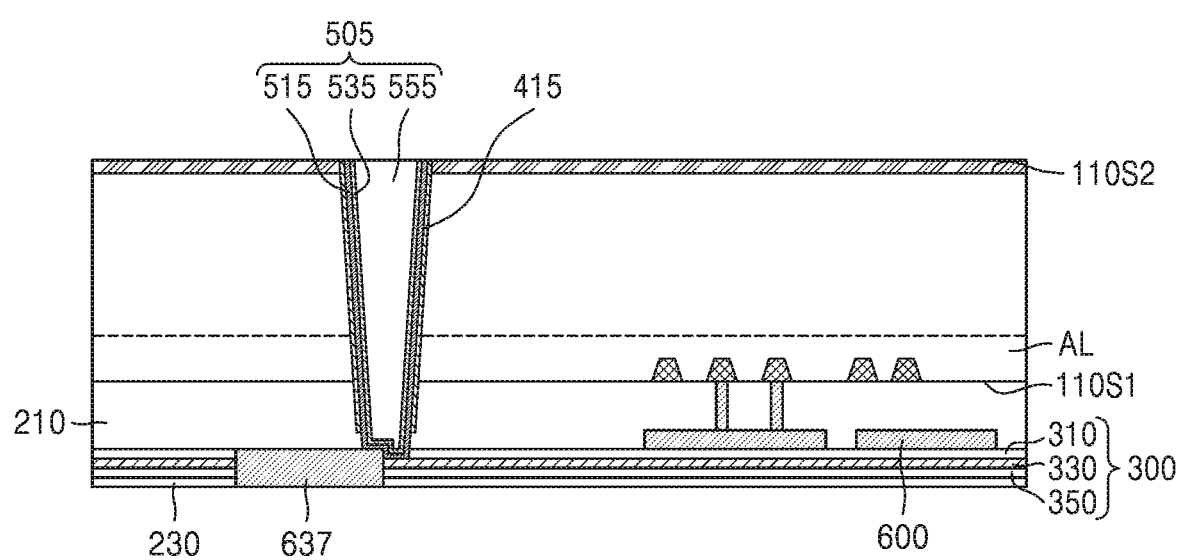

Referring to FIG. 10I, the mask pattern MP, the separation layer 415, the barrier pattern 515, the seed pattern 535, and a part of the conductive via 555 disposed on the second surface 110S2 of the semiconductor substrate 110 may be removed.

In an embodiment of the present inventive concept, the mask pattern MP, the separation layer 415, the barrier pattern 515, the seed pattern 535, and the conductive via 555 may be removed through a planarization process. The planarization process may include a chemical mechanical polishing (CMP) process. Also, the barrier pattern 515, the seed pattern 535, and the conductive via 555 removed through the planarization process may form the through electrode structure 505. That is, the through electrode structure 505 may include the barrier pattern 515, the seed pattern 535, and the conductive via 555 remaining after the planarization process.

The mask pattern MP remaining after the planarization process may form the above-described third insulating layer 250. However, the present inventive concept is not limited thereto, and the planarization process may be performed until the second surface 110S2 of the semiconductor substrate 110 is exposed.

Figure 10J:
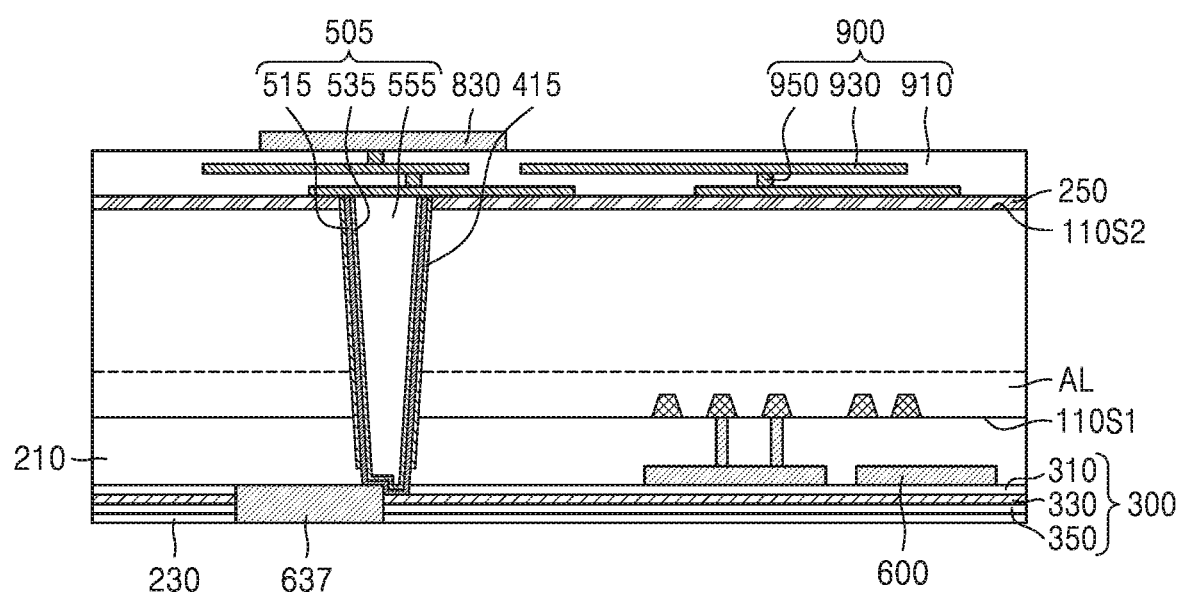

Referring to FIG. 10J, an operation of forming the upper wiring structure 900 on an upper surface of the third insulating layer 250 and an upper surface of the through electrode structure 505 may be performed. For example, the operation of forming the upper wiring structure 900 may include an operation of forming the upper wiring insulating layer 910 on the third insulating layer 250, and an operation of patterning the upper wiring insulating layer 910 and forming the upper wiring line pattern 930 and the upper wiring via pattern 950. The upper wiring line pattern 930 may include two or more layers extending in the horizontal direction. The upper wiring via pattern 950 may extend in the vertical direction inside the upper wiring insulating layer 910 to interconnect the plurality of upper wiring line patterns 930.

An operation of forming the conductive pad 830 on the upper wiring structure 900 may be additionally performed. The conductive pad 830 may be electrically connected to the through electrode structure 505 through the upper wiring structure 900. For example, the conductive pad 830 may contact a part of the upper wiring via pattern 950, and may be electrically connected to the through electrode structure 505 via the upper wiring via pattern 950 and the upper wiring line pattern 930.

As described above, the manufacturing of the semiconductor device 30 according to an embodiment of the present inventive concept may be completed.

In the method of manufacturing the semiconductor device 30 according to an embodiment of the present inventive concept, the etch stop structure 300 including the plurality of etch stop layers 310, 330, and 350 may be used as a stopper layer in the operation of etching the semiconductor substrate 110 and the first insulating layer 210.

The etch stop layers 310, 330, and 350 of the etch stop structure 300 may have a structure in which two materials having different etch selectivities are alternately stacked. Degrees of etching of the semiconductor substrate 110 and the first insulating layer 210 may be finely controlled through the etch stop structure 300. Accordingly, a physical damage to the contact wiring pattern 637 may be prevented in the process of manufacturing the semiconductor device 30, and reliability of a connection structure between the contact wiring pattern 637 and the through electrode structure 505 may be enhanced.

While the present inventive concept has been particularly shown and described with reference to embodiments thereof, it will be understood that various changes in form and details may be made therein without departing from the spirit and scope of the present inventive concept as defined in the appended claims.

What is claimed is:

1. A semiconductor device comprising:
   a semiconductor substrate having a first surface adjacent to an active layer;
   a first insulating layer disposed on the first surface of the semiconductor substrate;
   a second insulating layer disposed on the first insulating layer;
   an etch stop structure interposed between the first insulating layer and the second insulating layer and comprising a plurality of etch stop layers;
   a contact wiring pattern disposed inside the second insulating layer and surrounded by at least one etch stop layer of the plurality of etch stop layers; and
   a through electrode structure configured to pass through the semiconductor substrate, the first insulating layer, and at least one etch stop layer of the plurality of etch stop layers in a vertical direction and contact the contact wiring pattern,
   wherein an upper surface of the contact wiring pattern is higher than a lower surface of the etch stop structure, and is not higher than an upper surface of the etch stop structure.

2. The semiconductor device of claim 1, wherein the etch stop structure comprises:
   a first etch stop layer disposed on a lower portion of the first insulating layer and configured to surround a part of a side surface of the through electrode structure;
   a second etch stop layer disposed on a lower portion of the first etch stop layer, configured to surround a part of the side surface of the through electrode structure, and configured to contact the contact wiring pattern; and
   a third etch stop layer disposed between the second etch stop layer and the second insulating layer and configured to surround a part of a side surface of the contact wiring pattern.

3. The semiconductor device of claim 2, wherein a lower surface of the second etch stop layer is coplanar with the upper surface of the contact wiring pattern.

4. The semiconductor device of claim 2, wherein a material of the first etch stop layer is different from a material of the second etch stop layer, and
   the material of the first etch stop layer is the same as a material of the third etch stop layer.

5. The semiconductor device of claim 4, wherein an etch rate of the material of the first etch stop layer in a dry etching process is lower than an etch rate of the material of the second etch stop layer in the dry etching process.

6. The semiconductor device of claim 4, wherein the material of the first etch stop layer comprises at least one of nickel (Ni), copper (Cu), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), aluminum (Al), or ruthenium (Ru), and
   the material of the second etch stop layer comprises at least one of silicon (Si), carbon (C), oxygen (O), nitrogen (N), or hydrogen (H).

7. The semiconductor device of claim 2, wherein each of the first etch stop layer, the second etch stop layer, and the third etch stop layer has a thickness of about 1 nanometer to about 10 nanometers.

8. The semiconductor device of claim 2, further comprising:
   a separation layer interposed between the through electrode structure and the semiconductor substrate, between the through electrode structure and the first insulating layer, and between the through electrode structure and the first etch stop layer.

9. The semiconductor device of claim 8, wherein the through electrode structure comprises:
   a barrier pattern disposed along a surface of the separation layer and configured to contact the contact wiring pattern;
   a seed pattern disposed along a surface of the barrier pattern; and
   a conductive via disposed on the seed pattern and filled in a via hole defined by the barrier pattern and the seed pattern,
   wherein uppermost surfaces of the barrier pattern, the seed pattern, and the conductive via are coplanar with each other.

10. The semiconductor device of claim 1, wherein a width of the through electrode structure is about 30 nanometers to about 200 nanometers.

11. The semiconductor device of claim 1, wherein the through electrode structure comprises:
    a first through electrode portion configured to overlap the contact wiring pattern in the vertical direction; and a second through electrode portion disposed outside from a side surface of the contact wiring pattern.

\* \* \* \* \*